United States Patent
Suzuki et al.

(10) Patent No.: US 10,399,254 B2
(45) Date of Patent: Sep. 3, 2019

(54) SEAMLESS MOLD MANUFACTURING METHOD

(71) Applicant: ASAHI KASEI KABUSHIKI KAISHA, Tokyo (JP)

(72) Inventors: Masaru Suzuki, Tokyo (JP); Yoshimichi Mitamura, Tokyo (JP); Masatoshi Maeda, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/986,027

(22) Filed: Dec. 31, 2015

(65) Prior Publication Data
US 2016/0114503 A1    Apr. 28, 2016

Related U.S. Application Data

(63) Continuation of application No. 12/864,212, filed as application No. PCT/JP2009/051095 on Jan. 23, 2009, now abandoned.

(30) Foreign Application Priority Data

Jan. 25, 2008 (JP) ................. 2008-015331
Apr. 11, 2008 (JP) ................. 2008-103957

(51) Int. Cl.
*B29C 59/00* (2006.01)
*B29C 33/42* (2006.01)
(Continued)

(52) U.S. Cl.
CPC ........ *B29C 33/424* (2013.01); *B29C 33/3842* (2013.01); *B82Y 10/00* (2013.01);
(Continued)

(58) Field of Classification Search
CPC ........ B82Y 10/00; B82Y 40/00; G03F 7/0002
See application file for complete search history.

(56) References Cited

U.S. PATENT DOCUMENTS 5,099,100 A * 3/1992 Bersin ............... H01J 37/32009
156/345.43
5,259,926 A    11/1993 Kuwabara et al.
(Continued)

FOREIGN PATENT DOCUMENTS

CN    101095082 A    12/2007
EP    0481753 A2    4/1992
(Continued)

OTHER PUBLICATIONS

Chinese Office Action for Chinese Application No. 200980103169.7 dated Oct. 8, 2012.
(Continued)

*Primary Examiner* — Ryan M Ochylski
(74) *Attorney, Agent, or Firm* — Birch, Stewart, Kolasch & Birch, LLP

(57) ABSTRACT

A seamless mold manufacturing method of the invention is a seamless mold manufacturing method having the steps of forming a thermal reaction type resist layer on a sleeve-shaped mold, and exposing using a laser and developing the thermal reaction type resist layer and thereby forming a fine mold pattern, and is characterized in that the thermal reaction type resist layer is comprised of a thermal reaction type resist having a property of reacting in predetermined light intensity or more in a light intensity distribution in a spot diameter of the laser.

19 Claims, 11 Drawing Sheets

(51) Int. Cl.
*B82Y 10/00* (2011.01)
*B82Y 40/00* (2011.01)
*G03F 7/00* (2006.01)
*B29C 33/38* (2006.01)
*C23C 14/34* (2006.01)
*B29C 33/56* (2006.01)
*B41C 1/05* (2006.01)

(52) U.S. Cl.
CPC .......... *B82Y 40/00* (2013.01); *C23C 14/3407* (2013.01); *G03F 7/0002* (2013.01); *B29C 33/56* (2013.01); *B29K 2833/04* (2013.01); *B29K 2905/00* (2013.01); *B41C 1/05* (2013.01); *H01J 2237/281* (2013.01)

(56) References Cited

U.S. PATENT DOCUMENTS

| | | | |
|---|---|---|---|
| 5,760,880 | A | 6/1998 | Fan et al. |
| 5,772,905 | A | 6/1998 | Chou |
| 6,222,157 | B1 | 4/2001 | Langille et al. |
| 6,285,002 | B1 | 9/2001 | Ngoi et al. |
| 7,465,530 | B1 | 12/2008 | Chen et al. |
| 2004/0170916 | A1 | 9/2004 | Kouchiyama et al. |
| 2004/0219452 | A1 | 11/2004 | Rhodes et al. |
| 2005/0058947 | A1 | 3/2005 | Rinehart et al. |
| 2005/0112472 | A1 | 5/2005 | Kutsch et al. |
| 2005/0161842 | A1 | 7/2005 | Kai et al. |
| 2005/0266693 | A1 | 12/2005 | Maekawa |
| 2006/0213866 | A1 | 9/2006 | Hirotsu et al. |
| 2006/0234168 | A1 | 10/2006 | Kim et al. |
| 2006/0272529 | A1* | 12/2006 | Van Denend ............ B41C 1/05 101/401.1 |
| 2007/0025208 | A1 | 2/2007 | Hashimoto |
| 2007/0036933 | A1 | 2/2007 | Endoh et al. |
| 2011/0053094 | A1 | 3/2011 | Yang et al. |

FOREIGN PATENT DOCUMENTS

| | | |
|---|---|---|
| EP | 1 583 091 A1 | 10/2005 |
| JP | 60-153128 A | 8/1985 |
| JP | 5-16230 A | 1/1993 |
| JP | 2003-156633 A | 5/2003 |
| JP | 2003-175514 A | 6/2003 |
| JP | 2003-315988 A | 11/2003 |
| JP | 2005-106991 A | 4/2005 |
| JP | 2005-153223 A | 6/2005 |
| JP | 2005-238719 A | 9/2005 |
| JP | 2006-1043 A | 1/2006 |
| JP | 2006-5022 A | 1/2006 |
| JP | 2006-19707 A | 1/2006 |
| JP | 2006-315347 A | 11/2006 |
| JP | 2007-48356 A | 2/2007 |
| JP | 2007-507725 A | 3/2007 |
| JP | WO 2007/023960 A1 | 3/2007 |
| JP | 2007-144995 A | 6/2007 |
| JP | 2007-148463 A | 6/2007 |
| JP | 2007-216263 A | 8/2007 |
| JP | 2007-258419 A | 10/2007 |
| JP | 2008-229869 A | 10/2008 |
| TW | I228758 B | 3/2005 |
| WO | WO 2004/064057 A1 | 7/2004 |
| WO | WO 2007/111469 A1 | 10/2007 |

OTHER PUBLICATIONS

European Search Report for European Application No. 09 704 509.0 dated Jan. 31, 2012.
International Search Report, dated Feb. 24, 2009, issued in PCT/JP2009/051095.
Japanese Notification of Reasons for Rejection dated Jan. 17, 2012 for Japanese Application No. 2009-550577.
Official Communication for European Application No. 09 704 509.0 dated Mar. 13, 2012.
Taiwanese Office Action for Taiwanese Application No. 098103164 dated May 17, 2012.
Tan et al., "Roller nanoimprint lithography", J. Vac. Sci. Technol. B 16(6), Nov.-Dec. 1998, pp. 3926-3928.

* cited by examiner

SEAMLESS MOLD MANUFACTURING METHOD

CROSS-REFERENCE TO RELATED APPLICATIONS

This application is a Continuation of co-pending application Ser. No. 12/864,212 filed on Sep. 20, 2010, which is a National Phase of PCT International Application No. PCT/JP2009/051095 filed on Jan. 23, 2009, which claims priority under 35 U.S.C. § 119(a) to Patent Application No. 2008-015331 filed in Japan on Jan. 25, 2008 and Patent Application No. 2008-103957 filed in Japan on Apr. 11, 2008. All of the above applications are hereby expressly incorporated by reference into the present application.

TECHNICAL FIELD

The present invention relates to a seamless mold manufacturing method, and more particularly, to a method of manufacturing a seamless mold for nanoimprint and optical films.

BACKGROUND ART

Conventionally, as a method of providing nanoimprint, optical element or the like with a fine shape, such a method has been adopted that the shape is transferred to a glass substrate, plastic substrate, plastic film, etc. using a mold with the fine shape beforehand formed therein (Patent Documents 1 and 2).

Among these techniques are a method of pressing a mold (also referred to as a die or a template) that is an original plate with a pattern of fine grooves, holes, etc. formed therein against a transfer target material and thereby transferring the pattern mechanically, another method of transferring using a thermoplastic resin, still another method of optically transferring using a photo-curing resin, etc. (Patent Document 3). The resolution of the pattern in these methods is determined by fabrication accuracy of the mold. In other words, once the mold is prepared, it is possible to form the fine structure with an inexpensive apparatus. As the mold that is the original plate, known generally are a parallel flat-plate type mold (referred to as a wafer or plate) and a cylindrical (roller) type mold, from their shapes (Patent Document 4, Non-patent Document 1).

As the parallel flat-plate type mold, there are a method of applying an ultraviolet light resist, electron beam resist, X-ray resist or the like onto a substrate using the semiconductor lithography technique, then irradiating and exposing the substrate with/to ultraviolet light, electron beams, X-rays or the like, and fabricating an original plate of a desired pattern, and another method of fabricating an original plate through a mask (reticle) with a pattern beforehand rendered therein (Patent Document 5).

Theses methods are very effective methods in case of an extremely fine pattern of about 100 nm on a flat plate. However, since a photoresist using photoreaction is used, it is necessary to expose using a spot smaller than the pattern required in principle so as to form a fine pattern. Accordingly, since a KrF or ArF laser, etc. with short wavelengths is used as an exposure light source, the exposure apparatus is large and the complicated mechanism is required. Further, in the case of using an exposure light source of electron beam, X-ray or the like, since a vacuum is required as an exposure atmosphere, it is necessary to place the original plate in a vacuum chamber. Therefore, it is significantly difficult to increase the original plate size. Meanwhile, to fabricate a large-area mold using these methods, considered is a method of using a step-and-repeat function for connecting small exposure areas to fabricate, but there is a problem with accuracy of connection between patterns (Patent Document 6).

Meanwhile, as the method of fabricating a cylindrical (roller) type mold, two methods have conventionally been adopted. First, there is a method of fabricating a parallel flat-plate original plate once, transferring the shape by electroforming comprised of a thin foil made of nickel or the like, and winding the thin foil around a roller (Patent Document 7). Another method (seamless roller mold) is to directly render a mold pattern on a roller by laser processing or mechanical processing (Non-patent Document 2). In the former method, it is necessary to wind a nickel thin-foil mold with an area larger than the area to manufacture, and there is another problem that a seam arises in the winding portion. Meanwhile, in the latter method, once the mold is fabricated, the mold is high in productivity and excellent in volume production, but it is significantly difficult to form a pattern of the submicron (less than 1 µm) size using laser processing or mechanical processing.

Further, as another problem of the roller mold, there is a problem that is difficult to control the depth of the fine structure. Conventionally, in the parallel flat-plate type mold, to control the ratio between the width and the depth i.e. the aspect ratio, applied is dry etching having anisotropy in etching. In this case, since a method is adopted of etching while placing the flat-plate shaped mold and counter electrode to oppose to each other so that the distance between an etched portion and the opposed counter electrode is always equal during the etching, the etching proceeds uniformly in the same direction inside the flat-plate mold surface. The etching depth is controlled using the dry etching apparatus of such apparatus design. However, since a seamless roller mold has the need of etching a curved surface, in the case of using an ordinary flat-plate shaped counter electrode, portions arise where the distance between the etching layer and the flat-plate shaped counter electrode is not equal, the etching direction and etching rate thereby vary in part on the curved surface, and it has previously been difficult to control the aspect ratio using such a method.

As only a previous method of forming a seamless roller mold with a pattern of the submicron (less than 1 µm) size, there is a method of using an anodized porous alumina (Patent Documents 8 and 9). In this method, formed is an anodized porous alumina layer having a regular arrangement of fine holes, and the concavo-convex shape corresponding to the arrangement of fine holes is formed on a roll-shaped mold. However, in this method, the formable fine shape is limited to regular fine-hole shapes of the same size, and the method has problems that it is not possible to form fine-hole shapes with various dimensions on the same roll, or to form groove shapes having rectangular or V-shaped concavo-convex shapes.

[Patent Document 1] U.S. Pat. No. 5,259,926
[Patent Document 2] U.S. Pat. No. 5,772,905
[Patent Document 3] Japanese Unexamined Patent Publication No. 2005-238719
[Patent Document 4] Japanese Unexamined Patent Publication No. 2006-5022
[Patent Document 5] Japanese Unexamined Patent Publication No. 2007-144995
[Patent Document 6] Japanese Unexamined Patent Publication No. 2007-258419

[Patent Document 7] Japanese Translation Unexamined Patent Publication No. 2007-507725

[Patent Document 8] Publication No. WO 2007-023960

[Patent Document 9] Japanese Unexamined Patent Publication No. 2008-229869

[Non-patent Document 1] Hua Tan, Andrew Gibertson, Stephen Y. Chou, "Roller nanoimprint lithography" J. Vac. Sci. Technol. B16(6), 3926 (1998)

[Non-patent Document 2] "Collection of nanoimprint application examples", pages 611-612, published by JOHOKIKO Co., LTD.

DISCLOSURE OF INVENTION

Problems to be Solved by the Invention

The present invention was made in consideration of these points, and it is an object of the invention to provide a seamless mold manufacturing method for enabling a seamless mold having a pattern of the submicron (less than 1 μm) size to be obtained with high productivity and volume-production productivity.

Means for Solving the Problem

A seamless mold manufacturing method of the invention is a seamless mold manufacturing method having the steps of forming a thermal reaction type resist layer on a sleeve-shaped mold, and forming a fine mold pattern on the thermal reaction type resist layer using a laser, and is characterized in that the thermal reaction type resist layer is comprised of a thermal reaction type resist having a property of reacting in predetermined light intensity or more in a light intensity distribution in a spot diameter of the laser.

A seamless mold manufacturing method of the invention is a seamless mold manufacturing method having the steps of forming a thermal reaction type resist layer on a sleeve-shaped mold, and forming a fine mold pattern on the thermal reaction type resist layer using a laser, and is characterized in that the thermal reaction type resist layer is comprised of a thermal reaction type resist having a temperature distribution including a region where the resist reacts at a predetermined temperature or more in a spot diameter of the laser.

In the seamless mold manufacturing method of the invention, it is preferable to further have the steps of forming an etching layer on the sleeve-shaped mold before forming the thermal reaction type resist layer on the sleeve-shaped mold, etching the etching layer using the fine mold pattern as a mask, and removing the fine mold pattern.

In the seamless mold manufacturing method of the invention, the thermal reaction type resist is preferably an organic resist or inorganic resist.

In the seamless mold manufacturing method of the invention, it is preferable that the thermal reaction type resist is comprised of an imperfect oxide of an element selected from the group consisting of transition metals and group-XII to group-XV elements, and is an inorganic resist such that a boiling point of a primary fluoride of the element is 200° C. or more.

In the seamless mold manufacturing method of the invention, it is preferable that the transition metals in the inorganic thermal reaction type resist are elements selected from the group consisting of Ti, Cr, Mn, Fe, Co, Ni, Cu, Zr, Nb, Rh, Ag, Hf, Ta and Au.

In the seamless mold manufacturing method of the invention, it is preferable that the group-XII to group-XV elements in the inorganic thermal reaction type resist are elements selected from the group consisting of Al, Zn, Ga, In, Sn, Sb, Pb and Bi.

In the seamless mold manufacturing method of the invention, it is preferable that the transition metals in the inorganic thermal reaction type resist are elements selected from the group consisting of Ti, Cr, Mn, Co, Cu, Nb, Ag, Ta and Au, and that the group-XII to group-XV elements are elements selected from the group consisting of Sn, Pb and Bi.

In the seamless mold manufacturing method of the invention, it is preferable that the etching layer is a material selected from the group consisting of Si, Ta, and oxides, nitrides and carbides of Si and Ta.

In the seamless mold manufacturing method of the invention, it is preferable that a fluctuation range in the film thickness in the circumference of the sleeve of the thermal reaction type resist layer is configured to be at least ±20 nm or less with respect to an aimed layer thickness.

In the seamless mold manufacturing method of the invention, the thermal reaction type resist layer is preferably comprised of at least two layers.

In the seamless mold manufacturing method of the invention, it is preferable to further have the step of forming a heat absorption layer on or under the etching layer before forming the thermal reaction type resist layer on the etching layer.

In the seamless mold manufacturing method of the invention, it is preferable to further have the step of forming a heat insulating layer on the sleeve-shaped mold before forming the etching layer on the sleeve-shaped mold.

In the seamless mold manufacturing method of the invention, multilayer stacking methods in forming the thermal resist layer, etching layer and heat absorption layer are preferably performed using any one of a sputtering method, deposition method and CVD method.

In the seamless mold manufacturing method of the invention, a beam shape of the laser is preferably an elliptical shape in exposure using the laser.

In the seamless mold manufacturing method of the invention, it is preferable to use a dry etching apparatus in which the sleeve-shaped mold and a counter electrode in a position opposed to the mold surface are arranged in a vacuum chamber.

In the seamless mold manufacturing method of the invention, a shape of the counter electrode in the dry etching apparatus preferably uses a shape selected from a cylindrical shape, parallel flat-plate shape, and arc shape.

In the seamless mold manufacturing method of the invention, the dry etching apparatus preferably has a function of rotating the sleeve-shaped mold on the center axis.

Advantageous Effect of the Invention

According to the invention, it is possible to fabricate a fine pattern of 1 μm or less directly on a sleeve-shaped mold, and therefore, master mold fabricating techniques for nanoimprint or optical films are provided which provide a large area, are excellent in productivity, have a high degree of flexibility in the concavo-convex shape, and are capable of controlling the aspect ratio of the fine structure without restraint. Further, nanoimprint and optical films manufactured using the master mold prepared by the master mold fabricating techniques of the invention are continuous films without a seam with a fine shape pattern of 1 μm or less on the surface, and therefore, are able to sufficiently adapt to increases in the film area.

BEST MODE FOR CARRYING OUT THE INVENTION

Embodiments of the invention will specifically be described below with reference to accompanying drawings.

Figure 1:
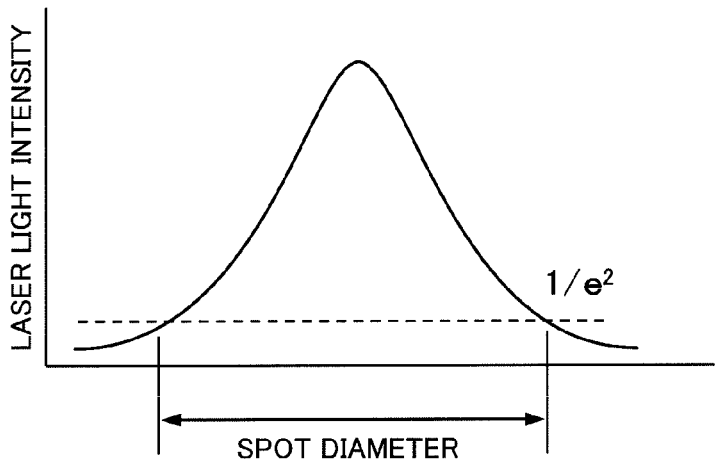
FIG. 1 is a diagram illustrating an intensity distribution of laser light.

The intensity of laser light focused by a lens usually shows a Gaussian distribution form as shown in FIG. 1. At this point, the spot diameter is defined by $1/e^2$. Generally, the reaction of a photoresist starts by absorbing energy represented by E=hv (E: energy, h: Plank constant, v: wavelength). Accordingly, the reaction is not dependent strongly on the intensity of the light, and instead, is dependent on the wavelength of the light, and therefore, in a portion (exposed portion) irradiated with the light, the reaction occurs in the almost entire portion. Hence, in the case of using the photoresist, the resist is exposed faithfully with respect to the spot diameter. It is said that this is a good property in the fields of semiconductor, etc. of placing importance on the exposure accuracy.

Figure 2:
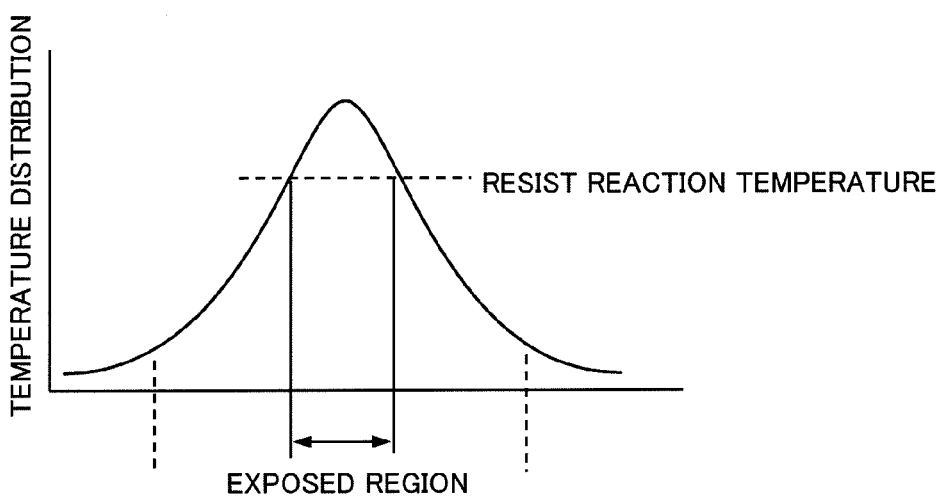
FIG. 2 is a diagram illustrating a temperature distribution of a portion irradiated with laser light.

Meanwhile, when a substance is irradiated with the laser light having the distribution as shown in FIG. 1, the temperature of the substance also shows the same Gaussian distribution as the intensity distribution of the laser light. At this point, when a resist i.e. thermal reaction type resist that reacts at a predetermined temperature or more is used, since the reaction proceeds only in a portion becoming a predetermined temperature (resist reaction temperature) or more as shown in FIG. 2, it is possible to expose a region (exposure region) smaller than a spot diameter. Accordingly, without shortening the wavelength of the exposure light source, it is possible to form a pattern finer than the spot diameter. By using the aforementioned thermal reaction type resist, the dependence of the wavelength of the exposure light source is reduced.

Thus, the above-mentioned thermal reaction type resist has the property of reacting in predetermined light intensity or more in the light intensity distribution in the spot diameter of the laser, or has the temperature distribution including a region where the resist reacts at a predetermined temperature or more in the spot diameter of the laser.

As an exposure light source to form a fine shape, DUV (Deep Ultra Violet) light sources such as KrF and ArF, electron beams, X-rays or the like have conventionally been used, but these light sources complicate optical series, and therefore, are extremely expensive and large-size equipment. Further, since the evacuation equipment is required in the electron beams, X-rays or the like, the irradiation area is small, and it is thereby extremely difficult to form a large-size mold. Furthermore, since the focus depth is shallow, the extremely flat plate is required, and it is thereby possible to expose a parallel flat-plate type mold, but in principle, it is difficult to expose a cylindrical sleeve-shaped mold while maintaining the high resolution.

To solve this problem, in the invention, exposure is performed using a semiconductor laser that is compact, inexpensive and that eliminates the need of specific equipment. For example, the wavelength of currently commercially available short-wavelength semiconductor lasers is about 405 nm, and the spot diameter of the laser is about 400 nm. Accordingly, the fine processing of 400 nm or less cannot be achieved in principle as long as a photoresist is used, but by using a thermal reaction type resist, it is possible to overcome the limitations. It is a feature of the invention to cause the thermal reaction type resist to react in predetermined light intensity or more in the light intensity distribution of the spot diameter of the laser, or have the temperature distribution including a region where the resist reacts at a predetermined temperature or more in the spot diameter of the laser, and thereby actualize processing finer than the spot diameter.

Figure 3:
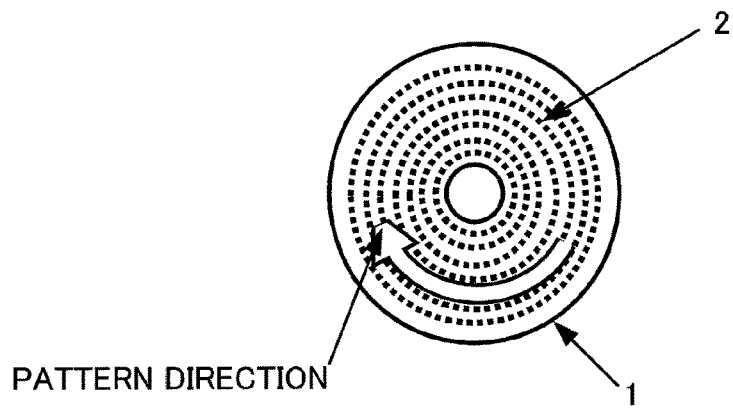
FIG. 3 is a diagram illustrating a pattern prepared by using an original disk of an optical disk.
Figure 4:
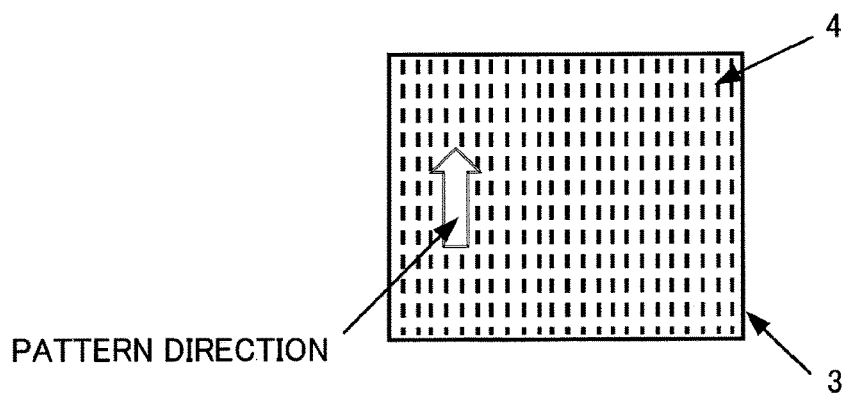
FIG. 4 is a pattern prepared by using a mold obtained by a method according to the invention.

Meanwhile, the technique of using thermal reaction type resists and exposing using the semiconductor laser is publicly known, for example, in International Publication No. WO2004-064057, etc. in the optical recording field. In optical recording, a disk-shaped parallel flat-plate type original disk is used, the disk 1 is rotated and exposed, and therefore, a fabricated pattern is a pattern 2 with the shape of concentric circles as shown in FIG. 3. However, this technique has not been used in the fields of nanoimprint, optical film and the like. The reason is that it is usually necessary to control the light in the vertical or parallel direction in the screen, for example, in uses for liquid crystal monitors and liquid crystal TVs that are the most typical use of the optical film, a linear pattern is thereby required. On the other hand, the pattern prepared from the disk-shaped parallel flat-plate original disk is not linear in principle, is the shape of concentric circles, and is not suitable absolutely for uses that require the linear pattern which is transferred on the substrates and films. Further, as distinct from optical recording, the productivity seriously deteriorates in the process of drawing a film or the like that is an object of transfer from a roll, instead of the parallel flat-plate type original plate, as in nanoimprint and optical elements. However, as in the invention, by using the thermal reaction type resist for the sleeve-shaped mold as described above, it is possible to form a linear pattern 4 on the film 3 or substrate as shown in FIG. 4. Further, this method has a feature of being excellent in mass-production productivity.

On the other hand, as the technique of irradiating a cylindrical shape using the semiconductor laser, there are electrophotographic apparatuses, lithographic apparatuses, image recording apparatuses, etc. First, in the electrophotographic apparatus i.e. the so-called copy machine or copier, such principles are used that a photosensitive material is provided on a cylindrical cylinder (also referred to as a drum), and is irradiated (exposed) with laser light, transfer or retaining amount of electric charges of the photosensitive material is changed corresponding to the presence or absence of irradiation, and that toner or the like is adsorbed by using the difference in the electric charge, and is transferred to paper or the like (for example, Japanese Unexamined Patent Publication No. 2004-151519).

However, in these uses, since it is necessary to mount the subsequent new information on the cylinder, forming a concavo-convex portion with permanent deformation on the cylinder by the laser light results in that the prior information remains, and is avoided as much as possible. The resolution required in these methods is about 10 µm to 20 µm, and the resolution of 1 µm or less aimed in the invention is not obtained. Accordingly, the publicly known conventional methods use the principles completely different from those of the invention, and the objects of the methods are also absolutely different from the object of the invention.

Next, the lithography technique is a method of providing a photosensitive resin or thermal reaction type resin on a flat-plane plate, cylindrical roller or sleeve to irradiate (expose) with laser light, thereby changing the affinity (hydrophilic property or lipophilic property) of the photosensitive material corresponding to the presence or absence of irradiation, or sublimating the photosensitive material, exposing a layer provided under the material, thereby changing the affinity, and providing the adhesion amount of ink to transfer with the difference in the affinity (for example, Japanese Unexamined Patent Publication Nos. H07-214744 and H10-858).

The importance in this use is adhesion between the plate and ink, and the shape is transferred to paper, etc. via the ink. In other words, the lithography technique is a technique of transferring the presence or absence of a pattern formed on the plate i.e. two-dimensional information to a medium, and in contrast thereto, the technique of providing nanoimprint, optical film or the like with the shape according to the invention is a technique of transferring both information of the width and depth of a pattern formed in the mold i.e. three-dimensional information to a medium. Accordingly, the lithography technique is completely different in principles from the invention, and the object of the technique is also absolutely different from that of the invention. Further, the resolution that can be achieved currently in the lithography technique is about 20 µm to 100 µm, and the resolution of 1 µm or less, so the purpose of the invention is not attained.

Further, also in the image recording apparatus, forms are shown that a drum is irradiated with laser light (for example, Japanese Unexamined Patent Publication Nos. 2000-310745 and H11-28833). These techniques are used to fabricate a machine plate for printing. The case of flat plate is as described above. Meanwhile, in the case of a concave plate or convex plate, the technique is to mount ink on the concavo-convex shape provided on the drum, and transfer an image to a medium such as paper. Since the techniques disclosed in above-mentioned Patent Documents, etc. do not use a thermal reaction type resist that reacts in a region smaller than the beam diameter of laser light, the resolution is about 10 µm to 50 µm, and the resolution of 1 µm or less, so the purpose of the invention cannot be achieved.

Furthermore, in the printing plates, since the information reproduced by transfer is formed by dimensions and concentration of dots on the transfer medium surface, only the resolution of the plate is important, and the depth of the concavo-convex portion is irrelevant. Meanwhile, the technique of providing nanoimprint and optical film with the shape is the technique of transferring not only the resolution of a pattern formed on the mold but also the information in the depth direction as described above. In other words, the printing technique is to transfer the two-dimensional information of the plate to a medium, and in contrast thereto, the technique of providing nanoimprint and optical film with the shape is the technique of transferring three-dimensional information of the mold to a medium, and has a completely different concept.

A seamless mold manufacturing method of the invention is a seamless mold manufacturing method for forming a thermal reaction type resist layer on a sleeve-shaped mold, and forming a fine mold pattern on the thermal reaction type resist layer using a laser, and is characterized in that the thermal reaction type resist layer is comprised of a thermal reaction type resist having a property of reacting in predetermined light intensity or more in a light intensity distribution in a spot diameter of the laser.

Further, a seamless mold manufacturing method of the invention is a seamless mold manufacturing method for forming a thermal reaction type resist layer on a sleeve-shaped mold, and forming a fine mold pattern on the thermal reaction type resist layer using a laser, and is characterized in that the thermal reaction type resist layer is comprised of a thermal reaction type resist having a temperature distribution including a region where the resist reacts at a predetermined temperature or more in a spot diameter of the laser.

In these methods, it is preferable to further have forming an etching layer on the sleeve-shaped mold before forming the thermal reaction type resist layer on the sleeve-shaped mold, etching the etching layer using the fine mold pattern as a mask, and removing the fine mold pattern.

In the manufacturing method of the invention, for example, there are (1) method of forming a thermal reaction type resist layer on a sleeve-shaped mold, exposing using a semiconductor laser, developing exposed portions and thereby fabricating the mold; (2) method of forming an etching layer and a thermal reaction type resist layer on a sleeve-shaped mold, exposing using a semiconductor laser, etching, removing the thermal reaction type resist layer and thereby fabricating the mold; and (3) method of forming an etching layer and a thermal reaction type resist layer on a sleeve-shaped mold, exposing using a semiconductor laser, developing exposed portions, etching after developing, removing the thermal reaction type resist layer and thereby fabricating the mold.

Using which method among methods of (1) to (3) is varied corresponding to the selection of resist, required resolution, and processing depth. In method (1), suitable as the resist is the type subjected to sublimation by exposure, and this method is suited to uses requiring relatively shallow depths. The developing and etching steps are not required, and therefore, the process is simple and inexpensive. In method (2), the resist is the type subjected to sublimation by exposure, and this method is suited to uses requiring relatively deep (high aspect ratio) processing. In method (3), suitable as the resist is the type of causing phase change or chemical reaction by exposure, and this method is suited to uses requiring high resolution and high aspect-ratio processing. However, corresponding to the steps, the process is complicated slightly.

The thermal reaction type resist used in the invention is preferably an organic resist or inorganic resist. The resist layer formed by these resists may be a single layer or multi-layer structure where some resist layers are combined. In addition, selecting which resist can be varied as appropriate corresponding to the process, required processing accuracy and the like. For example, the organic resist can be coated by a roll coater or the like when being formed on the sleeve, and the process is thus simplified. In addition, the resist is coated on the sleeve, and is limited in viscosity, and there are difficulties in accuracy and control of the coating thickness and multi-coating.

The aforementioned problem has been a significant issue in manufacturing a sleeve-shaped mold using the conventional photoresist. The photoresist has two, positive and negative, types, and has been used widely in integrated circuit manufacturing. Generally, the photoresist is made of an epoxy or acrylate organic material, and adopts a form of coating on a substrate in a liquid state. Usually, in integrated circuit manufacturing, the photoresist is dropped on a wafer with a spin coater, and the resist film thickness is controlled by the viscosity of the photoresist, the revolution speed of the wafer, or the like. However, in forming the photoresist on the surface of the sleeve-shaped mold in the same manner, since the photoresist is liquid having the predetermined viscosity, there is a problem that the resist film thickness is not uniformly formed on the circumference of sleeve mold according to the gravity. (Japanese Journal of Applied Physics Vol. 43 No. 6B, 2004, pp. 4031-4035, Yuuki Joshima et al.).

To avoid nonuniformity in the circumference, when a method is adopted of immersing a mold in a pot filled with the resist, rotating and lifting the mold, nonuniformity in the circumference direction is resolved, but nonuniformity conversely occurs in the axis direction of the mold, and it is significantly difficult to increase the length in the axis direction.

To solve the aforementioned problem, in Japanese Translation Unexamined Patent Publication No. 2007-507725, a method is applied of sandwiching a photoresist between transparent films to wind around a sleeve. In this method, nonuniformity of film thickness in the circumference and axis direction is solved, but a seam of the film certainly occurs in the circumference, and there is a problem that the mold is not a seamless mold aimed in the invention.

Further, as another problem in manufacturing when the photoresist is used, there is an effect by exposure time. According to the size of the mold, exposure of the mold requires an hour to several days in long duration. Therefore, the resist needs to exhibit stable properties during the long exposure time. Generally, the photoresist is diluted with an organic solvent or the like to control the viscosity. Accordingly, when the resist is left at room temperature for a long time, there is a problem that the organic solvent is volatilized and that the exposure property changes. Therefore, in integrated circuit manufacturing, etc. it is intended to complete exposure promptly after applying the resist.

With respect to the aforementioned problem of volatilization of organic solvent, the thermal reaction type resist has the advantage, where the light source is not light unlike the photoresist and the resist is exposed by heat originally based on the premise that the solvent is volatilized by heat. However, from the viewpoint of uniformity of film thickness, the resist is inferior to inorganic resists as described later.

Among organic resists suitable for the invention are novolac resins, mixtures of novolac resins and diazonaphthoquinone, methacrylate resins, polystyrene resins, polyethylene resins, phenol resins, polyimide resins, polyamide resins, silicones, polyester resins, epoxy resins, melamine resins, vinyl resins, etc. as described in "Latest Resist Material Handbook" published by JOHOKIKO Co., LTD. and "Photopolymer Handbook" of Kogyo Chosakai Publishing, Inc.

Meanwhile, thermal reaction type resist materials using inorganic materials such as metals and oxides according to the invention are capable of also solving the above-mentioned problem of nonuniformity of film thickness. As a method of forming the resist material, instead of coating, by forming the resist on the sleeve-shaped mold using a physical thin-film forming method, the effect of gravity is eliminated because the resist is not in a liquid state, and it is made possible to form the resist with a uniform film thickness on the sleeve. In addition, the normal thin-film forming apparatus is based on the premise that the resist is formed on a parallel flat-plate substrate such as a wafer, and is not capable of forming a thin film on the sleeve, and therefore, the inventors of the invention solved the problem by inventing a sputtering apparatus as disclosed in the present invention, for example.

With respect to uniformity of resist thickness described in the foregoing, the required degree of uniformity is dependent on the size of the required fine structure. For example, when the film thickness of the resist fluctuates in a range of several tens of micrometers, since exposure properties cannot be constant, it is extremely difficult to form a fine structure of the size of 100 nm. Usually, to form a fine structure of the size of nanometers, although depending on the resist thickness, it is necessary that the allowable resist thickness accuracy is at least ±20 nm or less, more preferably ±10 nm or less, and most preferably ±3 nm or less with respect to the aimed resist thickness (hereinafter, also shown by "d"). In addition, in the invention, the range of fluctuations of the resist thickness with respect to the aimed resist thickness (d), more specifically, the range of fluctuations of the resist thickness shown by the description of "±20 nm or less", "±10 nm or less", or "±3 nm or less" is referred to as a "fluctuation range".

It is extremely difficult to achieve the aforementioned resist thickness accuracy on the sleeve from various limitations. In the invention, to ensure the resist thickness accuracy in the circumference of the sleeve, a method of rotating the sleeve during film formation is adopted. Even in the case of simply rotating the sleeve, to ensure the resist thickness accuracy, it is necessary to select the deposition rate and rotation speed of the sleeve suitably. For example, in the case of high deposition rates, when the rotation speed of the sleeve is low, fluctuations tend to occur in the resist thickness. Meanwhile, in the case of low deposition rates, the low rotation speed is sufficient, but the deposition time becomes long.

To ensure the aforementioned resist thickness accuracy, the deposition rate per rotation of the sleeve requires 20 nm/rotation or less as the highest. More preferably, the deposition rate requires 10 nm/rotation or less. When the resist is formed at rates higher than such rates, unless the deposition start position is coincident with the finish position, fluctuations occur in the resist thickness. On the other hand, unless the deposition rate is 0.00001 nm/rotation or more, deposition is not completed for an actual time.

Further, the rotation speed of the sleeve is approximately determined by the total number of rotations that is the product of the speed and the deposition time. When the total number of deposition rotations is low, due to the effect of fluctuations in the deposition rate by shutter open/close time for starting and finishing deposition, mechanical axial fluctuations of the sleeve rotation axis, temperature variations during deposition and the like, the resist thickness uniformity degrades in the circumference. To solve this problem, by increasing the total number of rotations in the deposition, the deposition rate variations are averaged, and it is possible to reduce fluctuations.

For example, in the case that the resist thickness is 40 nm, when the deposition rate per rotation is 10 nm/rotation, the total number of rotations in the deposition is only 4 rotations. In this case, by increasing the rotation speed by 25 times, the total number of rotations is 100 rotations up to finish from deposition start. Therefore, the factor of resist thickness variations per rotation is reduced to $\frac{1}{100}$, and it is possible to control the effect on the resist thickness accuracy within 1%.

The total number of rotations between deposition start and finish is varied due to factors of deposition rate variations such as the shutter structure of the deposition apparatus, open/close time and sleeve rotation axis accuracy, and it is desired to ensure at least 500 rotations or more, and more preferably, 1000 rotations or more. Meanwhile, unless the total number of rotations is 1,000,000 or less, for example, even if the sleeve is rotated at 1000 rpm, the time required for deposition is about 16 hours and is not realistic.

The heat resist using inorganic materials such as metals and oxides is remarkably stable in chemical and physical properties at room temperature. Further, since an organic solvent or the like is not used because the resist is formed using the physical thin-film forming method, the properties are not changed against long exposure time, and the resist shows extremely stable properties.

By these inventions, heat reaction type resists were invented which provide uniform thicknesses in the circumference and axis direction and further, are stable against long exposure time, it was thereby made possible to form the stable fine shape as compared with the case of using the photoresist, and the seamless sleeve-shaped mold having the fine structure of 1 µm or less was actualized.

As a method of forming the above-mentioned inorganic thermal reaction type resist, it is suitable to provide the resist by the physical thin-film forming method such as a resistance heating deposition method, magnetron high-frequency sputtering method, electron-beam sputtering method and CVD method. These methods are basically of vacuum process, therefore need increased steps as compared with the coating method to form the resist on the sleeve, but enable the film thickness to be controlled with high accuracy as described previously, and further are ease in laminating the resist layer and etching layer in multi-layer.

As inorganic thermal reaction type resist materials suitable for the invention, it is possible to select various materials corresponding to the reaction temperature. For example, among such materials are Al, Si, P, Ni, Cu, Zn, Ga, Ge, As, Se, In, Sn, Sb, Te, Pb, Bi, Ag, Au and their alloys. Further, among the materials are included oxides, nitrides, nitrogen oxides, carbides, hydrosulphides, sulfides, fluorides, and chlorides of Mg, Al, Si, Ca, Ti, V, Cr, Mn, Fe, CO, Ni, Cu, Zn, Ga, Ge, As, Se, Sr, Y, Zr, Nb, Mo, Pd, Ag, In, Sn, Sb, Te, Ba, Hf, Ta, W, Pt, Au, Pb, Bi, La, Ce, Sm, Gd, Tb and Dy, and mixtures of such compounds.

Inorganic thermal reaction type resist materials particularly suitable for the invention among the aforementioned materials are imperfect oxides of elements selected from the group consisting of transition metals and group-XII to group-XV elements.

The "imperfect oxide" referred to as herein is a state where the oxygen content is insufficient with respect to the oxide of stoichiometry corresponding to the available valence of the element selected from the group consisting of transition metals and group-XII to group-XV elements. Using Cr as an example to explain, when the oxidation state of the chemical formula $CrO_3$ is converted into the ratio of the composition, the state is represented by $Cr_{1-x}O_x$, and the case of $x=0.75$ is the perfect oxide. Accordingly, the imperfect oxide indicates oxides represented by the scope of $0<x<0.75$. Further, in some elements, a single element is capable of forming oxides with different valences. In this case, the state where the oxygen content is insufficient with respect to the oxide of stoichiometry corresponding to the valence is also the imperfect oxide of the invention. In addition, it is possible to analyze the valence and oxygen amount of the element, for example, using an X-ray fluorescence analyzer.

The inorganic thermal reaction type resist material of the invention is comprised of the imperfect oxide, and has high resistance to dry etching processing using a fluorocarbon gas.

As described previously, when it is desired to form a pattern with a fine pattern shape and a deep groove depth, only using the thermal reaction type resist material alone is difficult to form, and required is a laminate structure where an etching layer is formed under the thermal reaction type resist material. In this case, the thermal reaction type resist material functions as a mask for a period during which the lower etching layer undergoes dry etching processing, and therefore, is required to have high dry etching resistance. In other words, it is important that the thermal reaction type resist material of the invention has a low etching rate in the thermal reaction type resist or is not etched in the dry etching processing by the fluorocarbon gas.

Herein, in the case of considering the mechanism of dry etching by the fluorocarbon gas, fluorine activated in the vacuum chamber of the dry etching apparatus is bound to the element used in the resist, and forms a fluoride. When the vapor pressure of the fluoride is relatively high (i.e. the case that the boiling point of the fluoride is relatively low), the fluoride is vaporized and disappears from the resist material, and as a result, the resist material is etched. Meanwhile, when the vapor pressure of the fluoride is relatively low (i.e. the case that the boiling point of the fluoride is relatively high), the fluoride is hard to vaporize, and the etching rate is low or the resist material is not etched.

Recently, as a result of repeated experiments, the inventors of the invention have found out that by selecting an element such that the boiling point of the primary fluoride of the element is 200° C. or more from among transition metals and group-XII to group-XV elements as a resist material, the resist material exhibits high resistance to the dry etching processing using the fluorocarbon gas, and confirmed the effect.

The boiling point of the primary fluoride of the element constituting the thermal reaction type resist material according to the invention is about 200° C. or more, more preferably about 250° C. or more, further preferably about 700° C. or more, and most preferably about 950° C. or more. As the boiling point of the fluoride increases, the resistance increases to dry etching using the fluorocarbon gas. Table 1 below shows boiling points of primary fluorides of elements constituting the thermal reaction type resist material according to the invention.

TABLE 1

| Fluoride | Boiling point (° C.) |
|---|---|
| $ZnF_2$ | 1497 |
| $CoF_2$ | 1400 |
| $AlF_3$ | 1291 |
| $PbF_2$ | 1290 |
| $InF_3$ | 1200 |
| $AgF$ | 1150 |
| $CrF_3$ | 1100 |
| $FeF_3$ | 1100 |
| $NiF_2$ | 1000 |
| $GaF_3$ | 1000 |
| $HfF_4$ | 968 |
| $CuF_2$ | 950 |
| $BiF_3$ | 900 |
| $MnF_2$ | 856 |
| $SnF_4$ | 705 |
| $RhF_3$ | 600 |
| $ZrF_4$ | 600 |
| $SbF_3$ | 376 |
| $AuF_3$ | 300 |
| $TiF_4$ | 284 |
| $NbF_5$ | 235 |
| $TaF_5$ | 230 |
| $WF_6$ | 17 |

Generally, in optical materials, films, etc. the aspect ratio (a value obtained by dividing the depth of the groove by the opening width of the groove) of the fine pattern is required to be at least 1 or more, preferably 2 or more, and more preferably 3 or more. When it is possible to select the aspect ratio freely, the flexibility of optical design is increased. Accordingly, it is indispensable that the thermal reaction type resist material according to the invention is high in dry etching resistance.

By using the elements such that the boiling point of the primary fluoride is 200° C. or more as shown in Table 1 as a thermal reaction type resist material, the thermal reaction type resist material is capable of having etching resistance about three times or more etching resistance of the etching layer. By using the thermal reaction type resist material having etching resistance three times or more, the thermal reaction type resist material functions as a mask to form deep grooves, the etching layer is capable of undergoing the etching processing, and it is possible to form a pattern shape with deep grooves.

The element used in the thermal reaction type resist material according to the invention is one or more elements selected from elements such that the boiling point of the primary fluoride of the element is 200° C. or more among transition metals and group-XII to group-XV elements. More specifically, the transition metals are Ti, Cr, Mn, Fe, Co, Ni, Cu, Zr, Nb, Rh, Ag, Hf, Ta and Au, and the group-XII to group-XV elements are Al, Zn, Ga, In, Sn, Sb, Pb and Bi. More preferably, the transition metals are Ti, Cr, Mn, Co, Cu, Nb, Ag, Ta and Au, and the group-XII to group-XV elements are Sn, Pb and Bi. In these elements, since the boiling point of the primary fluoride of the element is 200° C. or more, by using as a thermal reaction type resist material, as compared with the etching layer subjected to the dry etching processing by the fluorocarbon gas, the resist layer subjected to the same processing has dry etching resistance about three times or more. Among particularly preferable elements among the elements are Ti, Cr, Nb, Ta and Sn.

Meanwhile, boiling points of primary fluorides of elements W, Mo, As and S constituting thermal reaction type resist materials that have been reported previously are relatively 17° C., 35° C., 63° C. and −64° C., and thus low, and the elements are not able to function as an element of the thermal reaction type resist material according to the invention with high dry etching resistance (International Publication No. WO2004-064057, The 19th Symposium on Phase Change Optical Information Storage (2007) p 77).

Figure 5:
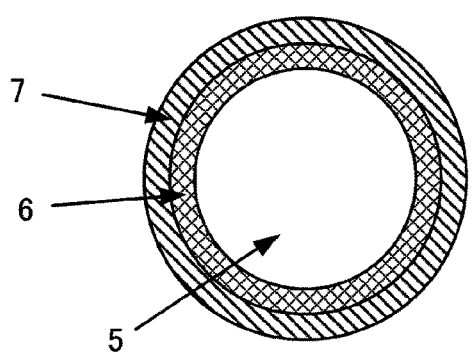
FIG. 5 is a cross-sectional view showing a sleeve mold in the method according to the invention.
Figure 6:
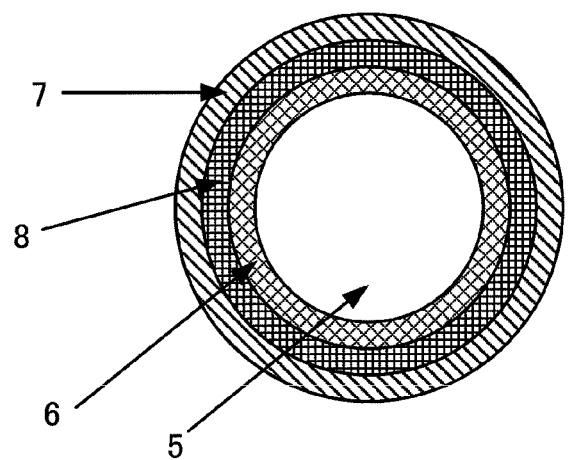
FIG. 6 is a cross-sectional view showing another example of the sleeve mold in the method according to the invention.
Figure 7:
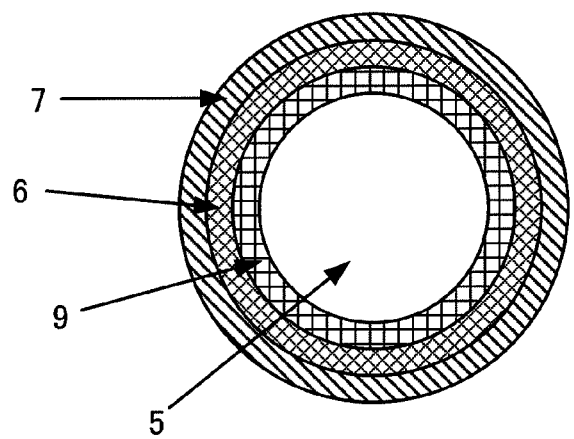
FIG. 7 is a cross-sectional view showing still another example of the sleeve mold in the method according to the invention.

Among sleeve-shaped objects of irradiation with the semiconductor laser in the method of invention are an object obtained by forming an etching layer 6 on the cylindrical mold 5, and further forming a resist layer 7 on the etching layer 6 as shown in FIG. 5, another object obtained by forming the etching layer 6 on the cylindrical mold 5, forming a heat absorption layer 8 on the etching layer 6, and further forming the resist layer 7 on the heat absorption layer 8 as shown in FIG. 6, and still another object obtained by forming a heat insulating layer 9 on the cylindrical mold 5, forming the etching layer 6 on the heat insulating layer 9, and further forming the resist layer 7 on the etching layer 6 as shown in FIG. 7. In addition, the heat absorption layer 8 shown in FIG. 6 may be provided under the etching layer 6.

In the object of irradiation as shown in FIG. 5, by providing the etching layer, it is possible to control the processing depth of the pattern freely, and to select the thickness of the thermal reaction type resist layer to a thickness most suitable for processing. In other words, by controlling the thickness of the etching layer, it is possible to control the processing depth freely. Further, since the processing depth is controlled by the etching layer, as the thickness of the thermal reaction type resist layer, it is possible to select thicknesses easy to expose or develop.

As materials used in the etching layer in the invention, to obtain etching anisotropy, among suitable materials are Si and polysilicon, semiconductor materials such as GaAs and InP, metals such as Al, Cu, W, Ti and Ta and their oxides, nitrides, carbides and alloys, insulating materials such as $SiO_2$, $Si_3N_4$ and glass, silicide materials such as $WSi_2$, $TiS_2$ and $CoSi_2$, and organic materials such as polyfluoroethylene, PMMA and PC. Among the materials, preferable are materials selected from the group consisting of Si, Ta and their oxides, nitrides and carbides, and particularly, semiconductor and insulating materials such as $SiO_2$, Si, $Si_3N_4$ and $Ta_2O_5$ are more suitable.

In the object of irradiation as shown in FIG. 6, the roles of the etching layer and thermal reaction type resist are the same as those in the case as shown in FIG. 5. Meanwhile, the role of the heat absorption layer is to widen the selection scope of light absorption properties in the thermal reaction type resist. Ordinarily, many materials for the thermal reaction resist have absorption at wide wavelengths, but there are some materials that do not have optical absorption at wavelengths of the semiconductor laser, for example, near 405 nm. In this case, the heat absorption layer absorbs the energy of the semiconductor laser to transfer into heat, and the heat enables the thermal reaction type resist to react. As materials for use in the heat absorption layer in the invention, suitable are materials having light absorption at wavelengths of the semiconductor laser, and examples of the materials include C, Mg, Al, Si, Ti, V, Cr, Mn, Fe, Co, Ni, Cu, Zn, Ge, Se, Zr, Nb, Mo, Pd, Ag, In, Sn, Sb, Te, Hf, Ta, W, Pt, Au, Pb, Bi and their alloys, and further include oxides, nitrides, hydrosulphides and carbides of the aforementioned elements, and their mixtures.

The object of irradiation as shown in FIG. 7 has the effect of preventing dissipation of thermal energy in a portion heated by irradiation with the semiconductor laser. Generally, the sleeve material is made of metal, glass or the like rich in workability. However, since the metal and glass has high thermal conductivity as compared with materials such as plastic, a phenomenon occurs that thermal energy in the portion heated by irradiation with the semiconductor laser escapes to the sleeve side. Accordingly, to heat the exposed portion to the reaction temperature of the thermal reaction type resist, a semiconductor laser with higher output is required. Increasing the output of the semiconductor laser leads to increases in size of optical parts and decreases in the life of the laser, and is not preferable. Therefore, as shown in FIG. 7, by providing the sleeve with the heat insulating layer, the heat is prevented from dissipating, and it is possible to use energy of the semiconductor laser with efficiency. In addition, as materials for use in the heat insulating layer, preferable are materials such as acrylic.

In the invention, in forming the inorganic thermal reaction type resist layer, it is preferable to form the film using the sputtering method, deposition method, and CVD method. Particularly, it is preferable to form the inorganic thermal reaction type resist layer and the etching layer by the sputtering method. As the method of forming the inorganic thermal reaction type resist layer, various methods are considered as described previously, but in consideration of uniformity of the film composition, film thickness control, productivity, etc. the sputtering method is the most suitable. Particularly, in the case of forming a large-size mold, it is necessary to form the uniform film with a large area. From this viewpoint, the sputtering method is suitable among vapor deposition methods.

In the invention, the conventional sputtering apparatus is manufactured based on the premise that the film is formed on a parallel flat plate such as a Si wafer and glass substrate, and therefore, cannot be applied to the sleeve-shaped mold in the invention without any modification. Therefore, to use the invention suitably, a sputtering apparatus as shown in FIG. 8 was newly invented which is adapted to applying the thermal reaction type resist to the sleeve-shaped mold.

Figure 8:
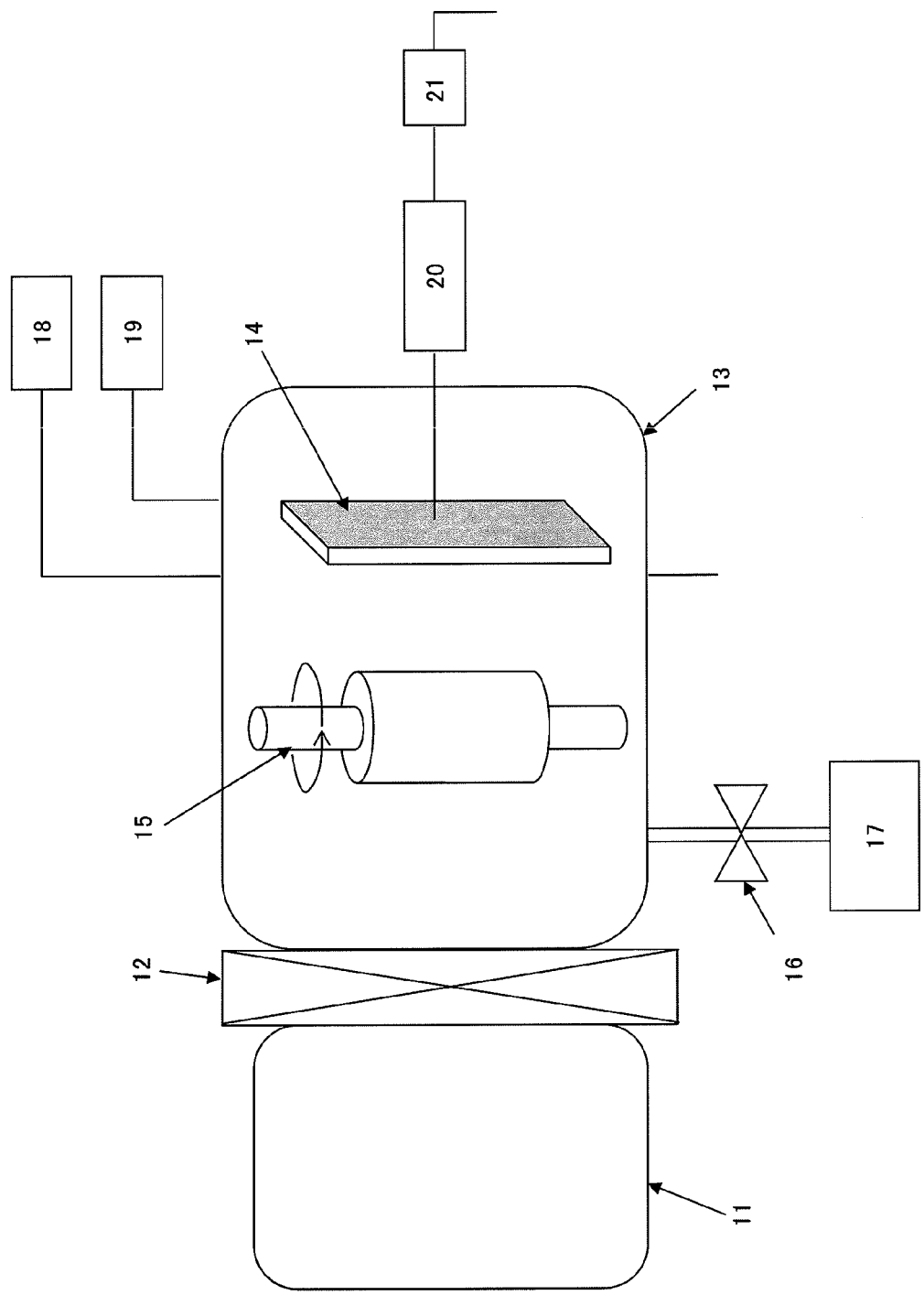
FIG. 8 is a schematic view showing an example of a sputtering apparatus used in the method according to the invention.

The sputtering method as shown in FIG. 8 is primarily comprised of a load lock chamber 11 to load an object of processing, and a chamber 13 coupled to the load lock chamber 11 via a valve 12. A target 14 is disposed inside the chamber 13, and a sleeve mold 15 is installed to oppose the target 14. Herein, the sleeve mold 15 is installed to stand, and rotates in the arrow direction. Further, the chamber 13 is connected to a vacuum pump 17 via a valve 16 so as to reduce the pressure inside the chamber 13. Furthermore, the chamber 13 is connected to a discharge gas supplying section 18 for supplying a discharge gas such as Ar gas and to a reactant gas supplying section 19 for supplying a reactant gas. Moreover, the target 14 is connected to a power supply 21 via a matching circuit 20.

In such an apparatus, the pressure inside the chamber 13 is reduced by the vacuum pump 17, and the sleeve mold 15 is rotated. Then, when the discharge gas is supplied from the discharge gas supplying section 18, the reactant gas is supplied from the reactant gas supplying section 19, and the power supply is turned on, sputtering is performed on the sleeve mold 15. In addition, in the sputtering apparatus, the target may be installed in each of a plurality of chambers to form a multi-layered resist layer successively. By this means, it is possible to avoid exposing the object of processing to atmosphere.

In the invention, the conventional sputtering apparatus is manufactured based on the premise that deposition or etching is performed on a parallel flat plate such as a Si wafer and glass substrate, and therefore, cannot be applied to the sleeve-shaped mold in the invention without any modification.

Figure 9:
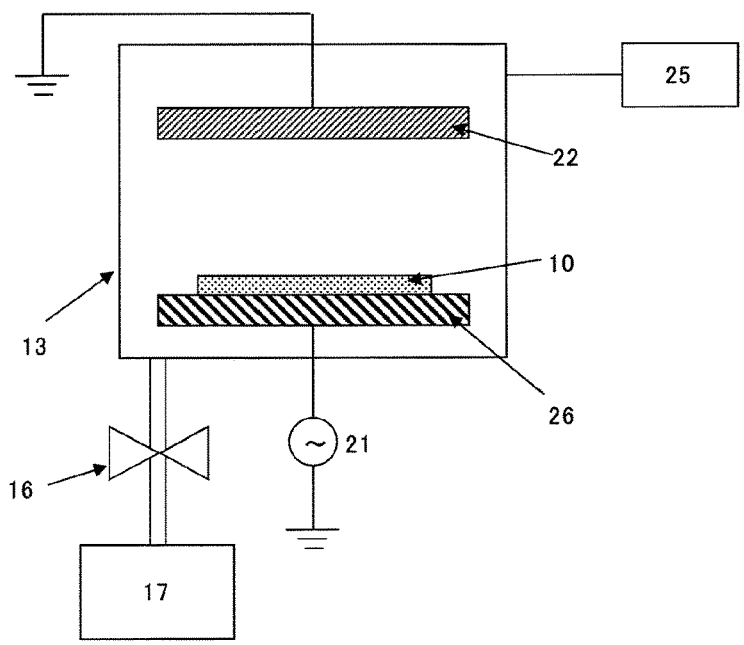
FIG. 9 is a diagram illustrating a parallel flat-plate dry etching apparatus.

As shown in FIG. 9, the normal dry etching apparatus adopts the form that the pressure inside a vacuum chamber 13 is reduced to introduce an etching gas 25, and that a high frequency 21 is applied to a substrate 10 placed on a stage 26 to generate plasma. The principles of dry etching are that etching gas molecules are ionized or become radicals by plasma, and chemically or physically react with the substrate, and that the substrate is etched.

Figure 10:
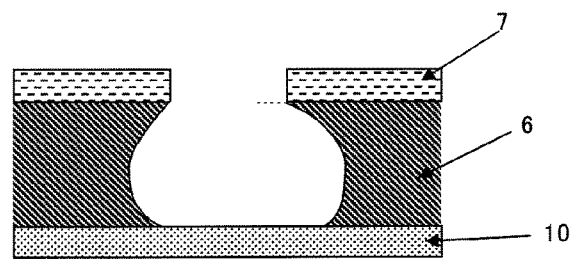
FIG. 10 is a diagram illustrating an etching profile of wet etching.
Figure 11:
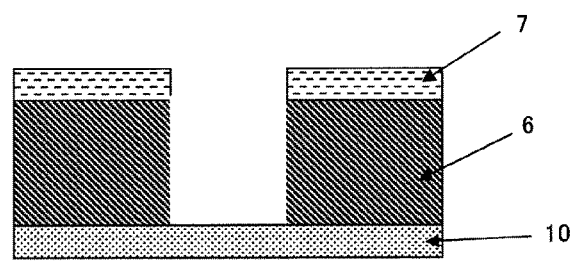
FIG. 11 is a diagram illustrating an etching profile of dry etching.

As a feature of dry etching, anisotropy in etching is easier to obtain than in wet etching. In wet etching, a substrate is immersed in an etching solution, and etching thereby proceeds. Therefore, as shown in FIG. 10, since etching does not have directionality with respect to the etching layer 6 provided below the resist layer 7, the substrate is etched isotropically. Meanwhile, in dry etching, as shown in FIG. 9, by accelerating ions by the electric field applied to between the substrate 10 and counter electrode 22, the ions collide with the surface of the substrate in the vertical direction, and thereby react with the substrate, and etching proceeds. Therefore, as shown in FIG. 11, the etching layer 6 is etched in the perpendicular direction to the substrate surface.

Figure 12:
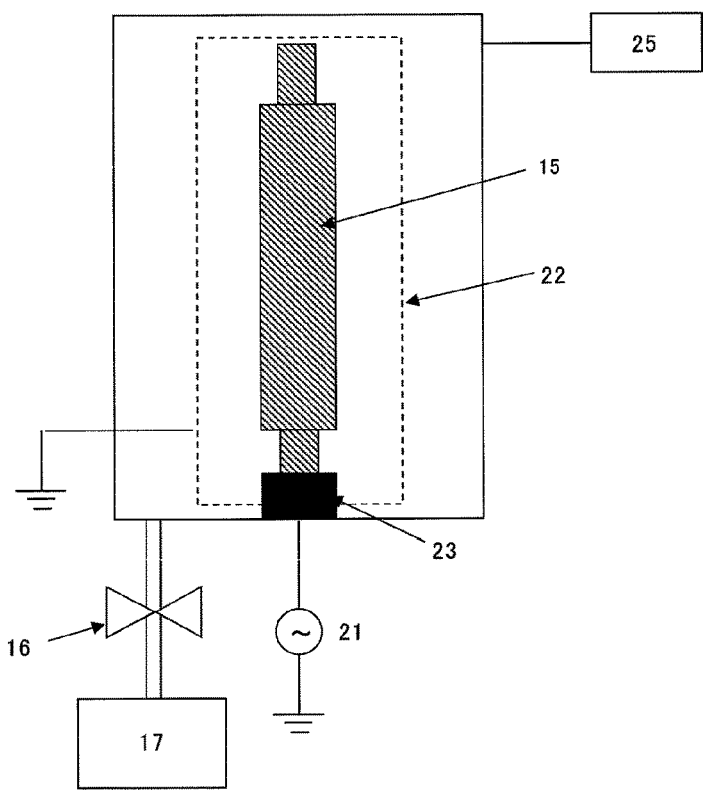
FIG. 12 is a diagram of a dry etching apparatus that does not rotate a sleeve in the invention.

In the invention, it is necessary to etch the substrate having a curved surface such as, for example, a roll and arc-shaped mold in the perpendicular direction to the tangent of the mold surface toward the center axis direction from the mold surface. As described above, to cause etching in the perpendicular direction to the tangent of the mold surface toward the center axis direction from the mold surface, the invention provides the dry etching apparatus comprised of the configuration that the sleeve-shaped mold 15 and the cylindrical counter electrode 22 in a position opposed to the surface of the mold are arranged inside the vacuum chamber. FIG. 12 shows the schematic configuration of the apparatus.

Figure 13:
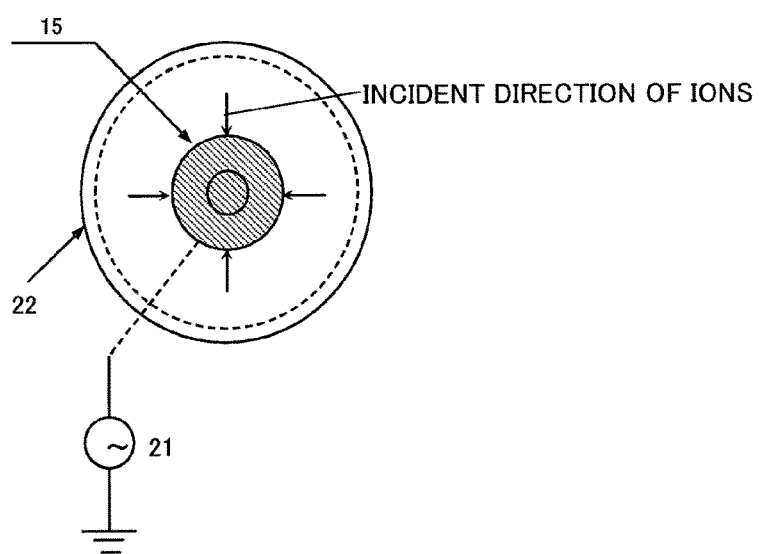
FIG. 13 is a diagram illustrating an incident direction of ions on the sleeve in the invention.

According to this apparatus, for example, when the high frequency is applied by a high frequency wave power supply 21 connected to the mold and the counter electrode 22 is grounded, a uniform electric field is formed between the mold and electrode in the perpendicular direction to the tangential direction of the mold surface toward the center axis direction from the mold surface. Accordingly, stable plasma is formed along the mold surface. Meanwhile, in between the plasma and mold occurs potential called sheath potential to sheathe the mold, and the electric field occurs in the perpendicular direction to the mold. As shown in FIG. 13 viewing FIG. 12 from above, the etching gas ions are accelerated along the electric field, and etching proceeds in the perpendicular direction to the tangent of the mold surface toward the center axis direction from the mold surface.

Another feature of the apparatus in FIG. 12 is that it is not necessary to rotate the mold in the etching processing. To apply a high frequency wave to a rotating mold, it is necessary to adopt the rotation mechanism and concurrently, the method of applying electricity, and the structure of a coupler 2 thereby becomes complicated. However, this method eliminates the need of rotating the mold, and therefore, makes design of the apparatus ease.

Figure 14:
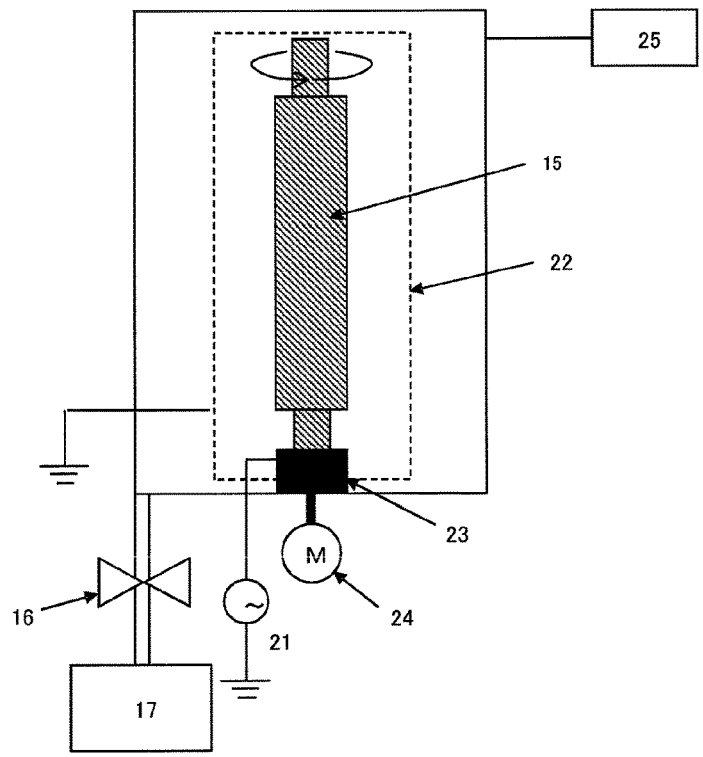
FIG. 14 is a diagram of a dry etching apparatus that rotates the sleeve in the invention.

Meanwhile, there is a possibility that the etching rate fluctuates due to fluctuations in gas flowing to the mold and/or a variation in the distance between the mold and the electrode. To solve these problems, in the invention, as shown in FIG. 14, during the etching processing, it is possible to rotate the sleeve-shaped mold 15 on the center axis via a motor 24 and coupler 23. By thus rotating the mold, it is possible to suppress the variation in the distance between the mold and the electrode, and further, by providing such a mechanism, as the shape of the counter electrode, it is made possible to use the arc shape and parallel flat-plate shape as well as the cylindrical shape. As an example, FIG. 14 shows an apparatus in the case that the counter electrode has the cylindrical shape.

In this method, even when fluctuations occur in the etching rate in the mold, the mold is rotated, the fluctuations are thereby uniformed during the rotation, and it is possible to eliminate the effect of the fluctuations in the etching rate.

Figure 15:
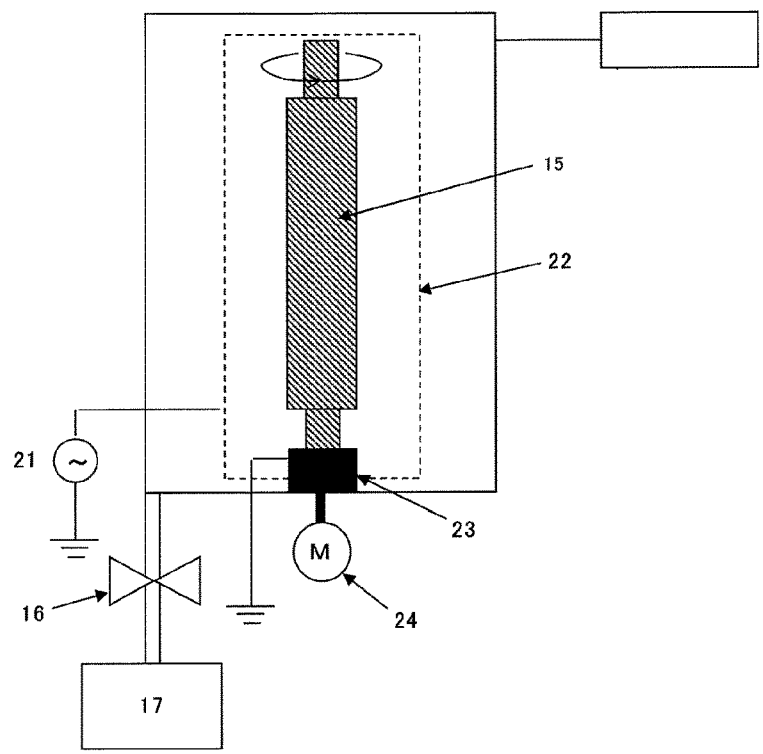
FIG. 15 is a diagram of a dry etching apparatus in applying a high frequency wave to a counter electrode in the invention.

In addition, as described previously, the coupler 23 for holding the mold needs design provided with both the rotation mechanism and high frequency wave transfer mechanism, but by adopting a circuit configuration where the high frequency wave is applied to the electrode side, while the mold side is grounded, the complicated design of the coupler 23 does not become (FIG. 15).

In the etching apparatus of the invention, it is naturally possible to etch the sleeve-shaped mold with the etching layer only formed on the mold, and it is also possible to etch the mold with the etching layer and the resist layer formed on the mold surface.

With respect to the etching gas suitable for the invention, various gases can be selected corresponding to the resist and material to be etched, and are not limited particularly, and examples of the gases include fluorocarbon such as $CF_4$, $CHF_3$, $C_2F_6$, $C_3F_8$, $C_4F_8$, $C_5F_8$, $CH_2F_2$, and $CCL_2F_2$, mixtures of the gases and a gas such as Ar, $O_2$, $H_2$, $N_2$ and CO, mixed gases of HBr, $NF_3$, $SF_6$, $CF_3Br$, HBr, $Cl_2$, HCl, HI, $BBr_3$, $BCl_3$, $Cl_2$ and $SiCl_4$, and mixtures of the mixed gas and a gas such as Ar, $O_2$, $H_2$, $N_2$ and CO.

In the invention, by optimizing conditions such as the kind of etching gas as described above, the composition of gases and etching temperature, it is also possible to control the etching direction. More specifically, it is possible to manufacture a groove with equal widths toward the center axis direction of the mold, and a groove in the V shape such that the width is narrowed toward the center axis direction.

Figure 16:
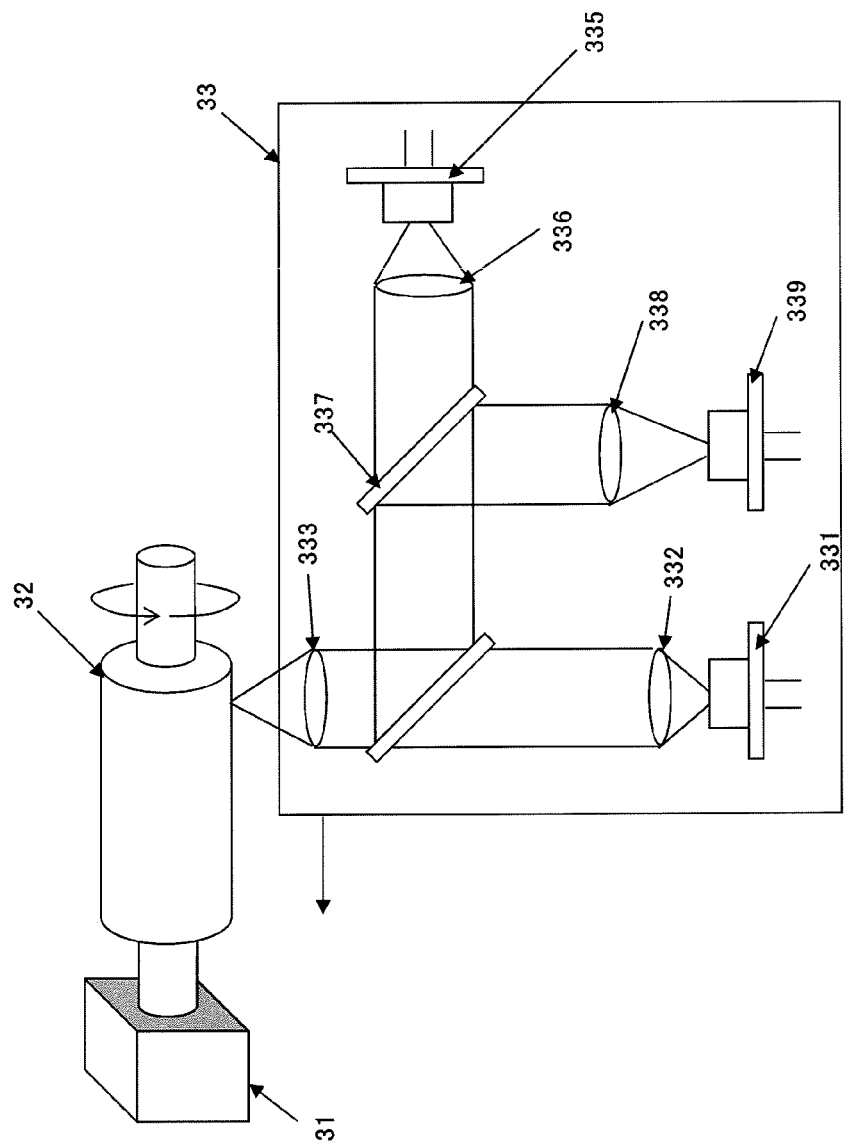
FIG. 16 is a schematic view showing an example of a configuration of an exposure apparatus and optical series used in the method according to the invention.

FIG. 16 is a diagram illustrating an exposure apparatus for exposing the resist layer formed on the sleeve mold in the method according to the invention. This exposure apparatus adopts a configuration for applying light to a sleeve mold 32 rotated by a spindle motor 31 through an optical series 33. In this optical series 33, laser light emitted from a semiconductor laser 331 for exposure is output to an objective lens 333 via a mirror 334 as parallel light by a collimator 332. Meanwhile, laser light emitted from a semiconductor laser 335 for focus is output to the objective lens 333 via a dichroic mirror 337 as parallel light by a collimator 336. Then, light condensed by the objective lens 333 is applied to the sleeve mold 32. In the optical series 33, the laser light emitted from the semiconductor laser 335 for focus is changed in optical path by the dichroic mirror 337, condensed the light by a condenser lens 338, and detected by a photodetector 339.

In this exposure apparatus, the optical series 33 is configured to shift in the long axis direction of the sleeve mold 32, and is capable of exposing the sleeve mold 32 from its end portion to the other end portion. Further, by displacing the position of the head of the optical series 33 corresponding to rotation of the sleeve mold 32, it is possible to fabricate a seamless mold without a seam. Further, the objective lens 333 of the semiconductor laser has a focus servo for tracking the variation of the sleeve mold 32, and it is thereby possible to control the emission light amount of the semiconductor laser to be constant. The focus servo may track up-and-down movements, may track right-and-left movements, or may have the both mechanisms. As shown in FIG. 16, to stabilize the servo, by using the semiconductor laser 335 for focus having a wavelength different from that of the semiconductor laser 331 for exposure, it is possible to provide servo characteristics free of influence from the variation of the semiconductor laser 331 for exposure.

Further, to suppress variations in the output of the semiconductor laser due to temperature and deterioration, the emission light amount of the semiconductor laser is monitored by the photodetector 339 to perform feedback control, and it is thereby possible to stabilize the output corresponding to the emission light amount. Furthermore, in the exposure apparatus, to improve the exposure rate, a plurality of semiconductor lasers 331 for exposure may be used, or a plurality of optical series 33 may be provided.

In this exposure apparatus, as the beam shape of the semiconductor laser, various shapes can be selected corresponding to the shape formed on the mold. For example, in the case of forming a circular shape on the mold, it is preferable that the beam shape of the semiconductor laser is also circular. Meanwhile, in the case of forming elliptical shapes extending in the rotation direction or groove shapes on the mold at narrow pitches, to avoid thermal interference among adjacent shapes in exposure, the beam shape of the semiconductor laser may be elliptical, and the major axis of the ellipse may be disposed in the right-angle direction to the long axis of the sleeve. Further, in the case of desiring to form a long shape parallel with the long axis of the sleeve or shapes in the rotation direction at short pitches on the mold, the major axis of the elliptical beam of the semiconductor laser is preferably disposed in parallel with the long axis of the sleeve.

As can be understood from the exposure principles and exposure apparatus described in the foregoing, with respect to the fine shape formed on the mold in the invention, it is possible to form various shapes. For example, by modulating the emission light amount of the semiconductor laser, it is possible to fabricate a variety of porous concavo-convex patterns, large and small, on the sleeve mold with the same roll shape. Further, by controlling the emission time and emission pattern of the semiconductor laser, it is also possible to fabricate fine structures from the shape of a crescent to the shape of a long ellipse. Furthermore, by causing the semiconductor laser to emit continuously for a certain time, it is also possible to fabricate consecutive or discontinuous groove shapes. Still furthermore, by selecting the thermal reaction type resist material and/or the dry etching conditions as appropriate, it is possible to fabricate groove shapes from the rectangle to the V shape. The fine shape fabricating method according to the invention is a method that is extremely high flexibility in the fine shape capable of being formed on the mold, as compared with the conventional method.

Previously, long films have been desired which are fine and high in the degree of flexibility in the concavo-convex shape. However, for example, in the case of antireflection films having concavo-convex portions on their surface, in the completely regularly arranged structure, there are cases that the viewing-angle dependence occurs where antireflection characteristics degrade depending on the light incident direction, and that moire fringes occur when the film is bonded to a material having the regular cell structure such as liquid crystal or plasma TV. Therefore, required is a structure with the regular arrangement having slightly irregularity or randomness having fine structures of various sizes. Further, in the case of producing continuously, when the shape of a pore is of structure close to perpendicular, a problem on which resin remains in the transferred to the mold occurs removal, and therefore, the shape of the pore also needs to a tapered shape with a certain angle. Furthermore, for example, in the field of optical film, there is a case of requiring a film that has a grid structure where the fine shape is a groove shape.

Accordingly, from the aforementioned requirements, the method needs to form at least a fine pattern with a high degree of flexibility in the concavo-convex shape on the transferred mold.

With respect to the aforementioned issue, in the conventional method of using a parallel flat-plate mold as an original plate, a mask with a pattern beforehand rendered is used and it is possible to solve the issue. However, in the method of using the parallel flat-shape mold, or the method of winding a thin-film mold to form a sleeve mold, since a seam certainly occurs in some place of the film, a continuous product is not obtained, and the productivity extremely degrades.

To manufacture such a film that is fine and high in the degree of flexibility in the concavo-convex shape and that does not have a seam, the mold itself needs to have both of the fine shape high in the degree of flexibility and the seamless shape without a seam.

The mold fabricated by the invention has a high degree of flexibility in the concavo-convex shape as described above, is seamless without a seam, and therefore, has characteristics that the mold is capable of supporting films with various shapes as compared with the conventional method, and is remarkably high in productivity.

As a method of manufacturing a film, there are the so-called heat nanoimprint method of pressing a film obtained by applying a thermoplastic resin onto a thermoplastic film or base film against the seamless sleeve with the film heated, and thereby transferring, the so-called UV imprint method of pressing a film obtained by applying a UV curing resin with low viscosity onto a base film against a seamless sleeve, and curing with UV light, a method of pressing a dry film resist obtained by laminating a semi-cured UV curing resin and a base film against a seamless sleeve, and thereby transferring the fine patter, etc.

Further, the object of transfer may not be a film. For example, in the case of forming a fine structure on a surface of a glass plate or metal plate, in the method of using a parallel flat-plate mold, or the method of winding a thin-film mold to form a sleeve mold, it is possible to perform production with the seam avoided by synchronizing the seam of the mold and the length of the plate. However, it is necessary to replace the mold to match the position of the seam whenever the length of the plate to produce is varied. Meanwhile, in the case of the seamless mold, the need of replacement is eliminated in plates of any sizes, and further, it is possible to produce plates with different lengths continuously in the same line.

In actual film manufacturing, it is preferable to use a seamless mold with the fine shape formed on the surface manufactured by the seamless mold manufacturing method of the invention. Further, by manufacturing a film using the seamless mold, it is possible to manufacture the continuous film without a seam having a fine concavo-convex pattern on the surface. Furthermore, the film fabricated by film manufacturing using the seamless mold becomes films having a fine concavo-convex pattern with high yield without waste of the material by a user cutting to an appropriate size. In fabricating a member having a fine structure of 1 μm or less on the surface, it is preferable to use a seamless mold such that the size of the fine shape on the surface is 1 μm or less. Further, by manufacturing a film using the seamless mold, it is possible to manufacture the continuous film without a seam having a fine concavo-convex pattern on the surface. Furthermore, the film fabricated by film manufacturing using the seamless mold becomes films having a fine concavo-convex pattern with high yield without waste of the material by a user cutting to an appropriate size.

Examples performed to clarify the effects of the invention will be described below.

Example 1

Figure 17:
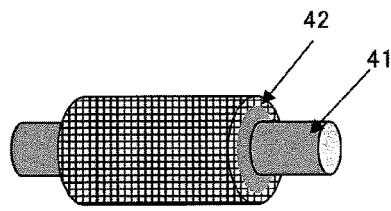
FIG. 17 is a diagram illustrating a form of a sleeve mold in Examples.

As shown in FIG. 17, metal sleeves 41 processed in φ of 30 mm and φ of 58 mm were prepared, an acrylic pipe 42 with a length of 200 mm, an inside diameter φ of 58 mm, and an outside diameter φ of 60 mm was attached to the outside of each of the sleeves 41, and cylindrical sleeves were configured. Herein, the acrylic pipe acts as a heat insulating layer.

Figure 18:
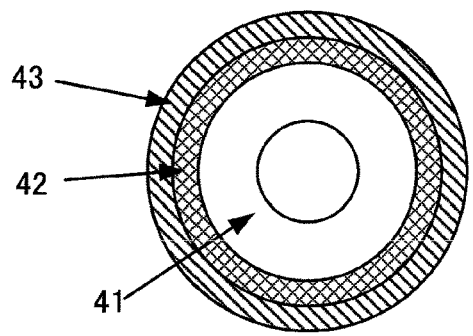
FIG. 18 is a cross-sectional view showing a sleeve mold in Example 1.

Next, using the sputtering apparatus as shown in FIG. 8, a thermal reaction type inorganic resist layer with a thickness (d) of 40 nm was formed on the sleeve prepared as described above. By this means, as shown in FIG. 18, a resist layer 43 was formed on the sleeve 41 via the acrylic pipe 42. In addition, to form the film uniformly on the sleeve, sputtering was performed while rotating the sleeve during the sputtering. When fluctuations in the resist film thickness in the circumference of the sleeve with the resist formed thereon were measured by X-ray fluorescence, the fluctuation range was ±3 nm or less with respect to the objective thickness (d)=40 nm. Herein, $SnO_x$ was used as the thermal reaction type inorganic resist. In this case, a target of Sn was installed in the sputtering apparatus, and the sputtering was performed in an atmosphere of mixed gas of Ar and $O_2$. At this point, the oxidation amount of Sn was changed by the mixing ratio between Ar and $O_2$. The results are shown in Table 2 below. From the results, it is possible to make the oxidation amount of Sn a value of $0 \leq x < 2$. In addition, the value of x was obtained from the peak ratio between Sn and $SnO_2$ by X-ray fluorescence.

TABLE 2

| No. | O2/Ar Flow ratio | Value of X of SnOx | Exposure power (mW) | Melting temperature (° C.) | Development time (sec) |
|---|---|---|---|---|---|
| 1 | 0.001 | 0.48 | 3.5 | 450 | 90 |
| 2 | 0.005 | 0.67 | 4.2 | 530 | 120 |
| 3 | 0.01 | 1.2 | 5.5 | 770 | 120 |
| 4 | 0.05 | 1.5 | 6.5 | 900 | 280 |
| 5 | 0.1 | 2 | 7.2 | 1127 | Not developed |

Thus prepared sleeve was exposed using the exposure apparatus (exposure apparatus installed with two lasers with different wavelengths i.e. laser for exposure and laser for focus) as shown in FIG. 16. In addition, the exposure conditions were as described below.
Wavelength of the laser for exposure: 405 nm
Lens numerical aperture: 0.85
Power of the laser for exposure: 3 mW to 8 mW
Wavelength of the laser for focus: 665 nm
Power of the laser for exposure: 0.2 mW
Rotation speed: 700 rpm
Feeding pitch: 200 nm/rotation
Sleeve exposure width: 200 mm In addition, it is possible to form various shapes and patterns by varying the intensity of the laser during exposure, but in the experiments, to confirm processing accuracy, the pattern was made continuous groove shapes. The shape to form may be an isolated circle, elliptical shape and the like corresponding to required uses, and the invention is not limited absolutely in the processing shape. Further, herein, the sleeve exposure width was set at 200 mm, but the exposure apparatus enables exposure in widths longer than the exposure width used in the experiments without any problem, while only the exposure time increases as the exposure width is increased.

Next, the resist exposed by the above-mentioned exposure apparatus was developed. As development, development by wet process was applied. It is possible to use acid, alkali, etc. as a developing solution, and herein, a tetramethylammonium aqueous solution (TMAH) was used. More specifically, a bath of 2.38% TMAH solution was prepared at 25° C., the sleeve was immersed in the bath, and development was performed. The development time varies with the oxidation amount of Sn, and is preferably about 1 to 5 minutes. In addition, in this Example, development was performed by the method of immersing the sleeve, and may be performed by spraying or dropping the developing solution to the sleeve.

Thus developed sleeve was rinsed, the surface shape of the sleeve was examined using a SEM (scanning electron microscope), and it was found that fine grooves with depths of about 40 nm and widths of about 100 nm were formed on the sleeve. Using the sleeve as a mold, the surface shape was transferred to a film using a UV curing resin, and almost the same shape that of the sleeve mold was transferred onto the film as the inversed shape. The reason is considered that the thermal reaction type resist has the property of reacting in predetermined light intensity or more in the light intensity distribution of the spot diameter of the laser.

Example 2

As shown in FIG. 17, metal sleeves 41 processed in ϕ of 30 mm and ϕ of 58 mm were prepared, an acrylic pipe 42 with a length of 200 mm, an inside diameter ϕ of 58 mm, and an outside diameter ϕ of 60 mm was attached to the outside of each of the sleeves 41, and cylindrical sleeves were configured. Herein, the acrylic pipe acts as a heat insulating layer.

Figure 19:
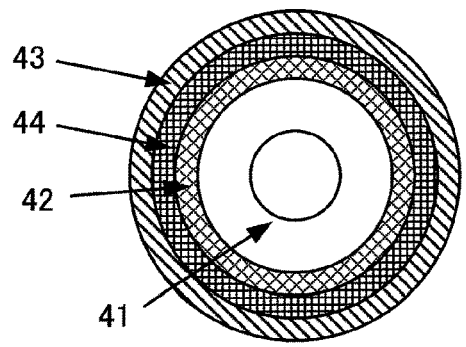
FIG. 19 is a cross-sectional view showing a sleeve mold in Example 2.

Next, using the sputtering apparatus as shown in FIG. 8, an etching layer with a thickness of 100 nm was formed on the sleeve prepared as described above, and then, a thermal reaction type inorganic resist layer with a thickness (d) of 40 nm was formed. By this means, as shown in FIG. 19, an etching layer 44 was formed on the sleeve 41 via the acrylic pipe 42, and a resist layer 43 was formed on the etching layer 44. In addition, to form the film uniformly on the sleeve, sputtering was performed while rotating the sleeve during the sputtering. When fluctuations in the resist film thickness in the circumference of the sleeve with the resist formed thereon were measured by X-ray fluorescence, the fluctuation range was ±3 nm or less with respect to the objective thickness (d)=40 nm. Herein, a $SiO_2$ film was used as the etching layer 44. In this case, a target of $SiO_2$ was installed in the sputtering apparatus, and the sputtering was performed in an atmosphere of Ar gas. Further, as the thermal reaction type inorganic resist, as in Example 1, $SnO_x$ (x=1.2) was used.

Thus prepared sleeve was exposed using the exposure apparatus as shown in FIG. 16. In addition, the exposure conditions were the same as in Example 1 except that only power of the laser for exposure was changed to 8 mW. After exposure, the resist was developed with a TMAH solution. The development conditions were the same as in Example 1.

After development, the etching layer 44 was etched using the etching apparatus as shown in FIG. 14. In addition, in order for the sleeve to be etched uniformly, etching was performed while rotating the sleeve during the etching. $CF_4$ gas was used as an etching gas. Further, the etching conditions were as described below.
Etching power: 150 W
Etching gas pressure: 10 Pa
Gas flow rate: 20 sccm After etching, the sleeve was rinsed, and the resist was removed (stripped). As resist stripping, a wet process was adopted. As a resist stripping solution, as in the developing solution, it is possible to apply acid, alkali, and other kinds, and herein, potassium hydroxide (KOH) was used. More specifically, the sleeve was immersed in a KOH solution with a concentration of 1M for about 5 minutes. By this means, the resist was stripped off neatly with the $SiO_2$ layer left.

After resist stripping, the sleeve was rinsed, the surface shape of the sleeve mold was examined using the SEM (scanning electron microscope), and it was found that fine grooves with depths of about 100 nm and widths of about 100 nm were formed on the sleeve. Using the sleeve as a mold, the surface shape was transferred to a film using a UV curing resin, and almost the same shape as that of the sleeve mold was transferred onto the film as the inversed shape. The reason is considered that the thermal reaction type resist has the property of reacting in predetermined light intensity or more in the light intensity distribution of the spot diameter of the laser.

Example 3

As shown in FIG. 17, metal sleeves 41 processed in ϕ of 30 mm and ϕ of 60 mm were prepared, and cylindrical sleeves were configured as in Example 1

Next, using the sputtering apparatus as shown in FIG. 8, an etching layer with a thickness of 200 nm was formed on the sleeve prepared as described above. Herein, a $SiO_2$ film was used as an etching layer 44. In this case, a target of $SiO_2$ was installed in the sputtering apparatus, and sputtering was performed in an atmosphere of Ar gas.

Figure 20:
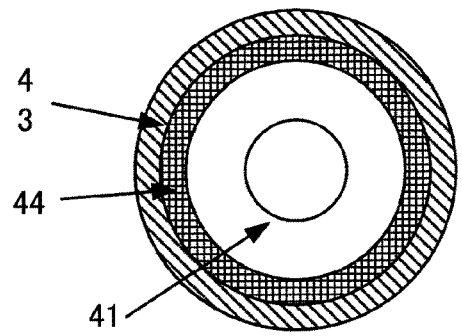
FIG. 20 is a cross-sectional view showing a sleeve mold in Example 3.
Figure 21:
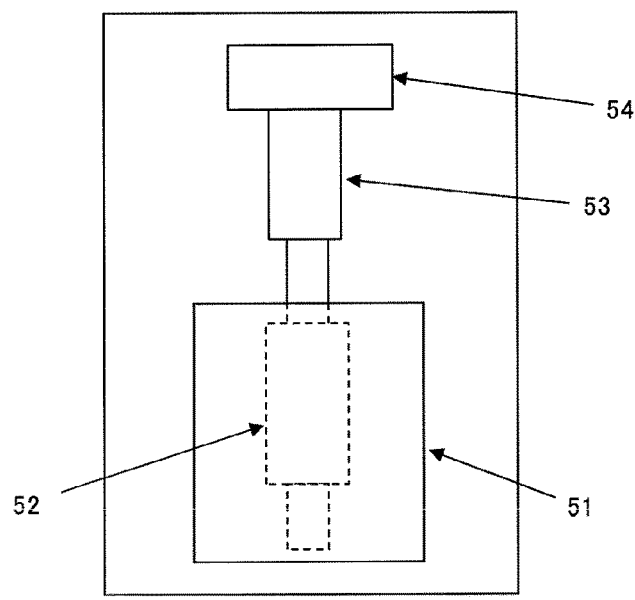
FIG. 21 is a schematic view showing an example of an apparatus for applying an organic resist to the sleeve mold used in Example 3.

Next, using the apparatus as shown in FIG. 21, a thermal reaction type organic resist layer 43 with a thickness of 0.5 μm was formed on the etching layer 44 of the sleeve. The apparatus as shown in FIG. 21 is an apparatus in which a chuck 53 for gripping a sleeve 52 is moved up and down by a motor 54 to immerse in a resist solution stored in a resist bottle 51, and after lifting, the sleeve is rotated. Using this apparatus, the thermal reaction type organic resist was applied onto the sleeve. By using the apparatus, it was possible to uniformly apply the resist onto the sleeve surface. In addition, as the thermal reaction type organic resist, novolac resin with viscosity of 700 cps was used. By this means, as shown in FIG. 20, the etching layer 44 was formed on the sleeve 41, and the resist layer 43 was formed on the etching layer 44.

Thus prepared sleeve was exposed using the exposure apparatus as shown in FIG. 16. In addition, the exposure conditions were the same as in Example 1 except that power of the laser for exposure was changed to 4 mW, and that the feeding pitch was changed to 500 nm/rotation. After exposure, the resist was developed in a TMAH solution, and the development time was 1 minute.

After development, the etching layer 44 was etched using the etching apparatus as shown in FIG. 14. In addition, in order for the sleeve to be etched uniformly, etching was performed while rotating the sleeve during the etching. $CF_4$ gas was used as an etching gas. Further, the etching conditions were the same as in Example 2.

After etching, the sleeve was rinsed, and the resist was removed (stripped). As resist stripping, a wet process was adopted. As a resist stripping solution, as in the developing solution, it is possible to apply acid, alkali, and other kinds, and herein, 1M nitric acid was used.

After resist stripping, the sleeve was rinsed, the surface shape of the sleeve mold was examined using the SEM (scanning electron microscope), and it was found that fine grooves with depths of 200 nm, widths of 300 nm and pitches of 500 nm were formed on the sleeve. Using the sleeve as a mold, the surface shape was transferred to a film using a UV curing resin, and almost the same shape as that of the sleeve mold was transferred onto the film as the inversed shape. The reason is considered that the thermal reaction type resist has the property of reacting in predetermined light intensity or more in the light intensity distribution of the spot diameter of the laser.

Example 4

Figure 22:
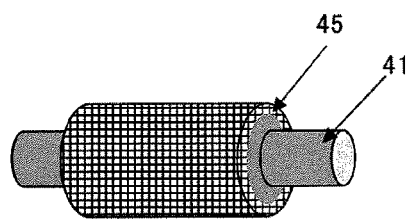
FIG. 22 is a diagram illustrating a form of a sleeve mold in Example 4.

Metal round bars 41 processed in φ of 30 mm and φ of 78 mm were prepared, an aluminium pipe 45 with a length of 200 mm, an inside diameter φ of 78 mm, and an outside diameter φ of 80 mm was attached to the outside of each of the bars 41, and cylindrical sleeve molds as shown in FIG. 22 were configured.

Using the sputter apparatus capable of performing sputtering on the sleeve as shown in FIG. 8, an etching layer 44 was first formed on the sleeve prepared as described above. As the etching layer, a target of $SiO_2$ was used, and sputtering was performed using Ar gas. The film thickness of the etching layer was set at 300 nm. Next, a thermal reaction type inorganic resist layer 43 was formed. Herein, $SnO_x$ was used as the thermal reaction type inorganic resist. A target of Sn was installed in the sputter apparatus, sputtering was performed in an atmosphere of mixed gas of Ar and $O_2$, and the oxidation amount of Sn was changed by the mixing ratio between Ar and $O_2$. The oxidation amount of Sn is capable of taking a value of $0 \leq x < 2$. The value of x was obtained from the peak ratio between Sn and $SnO_2$ by X-ray fluorescence, and x was adjusted to 0.5 (x=0.5). In addition, in forming each layer, to form the film uniformly on the sleeve, sputtering was performed while rotating the sleeve during the sputtering.

Figure 23:
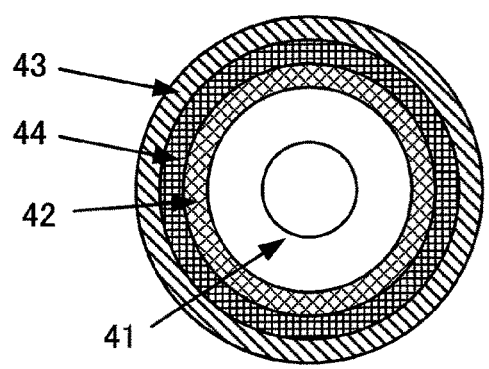
FIG. 23 is a cross-sectional view of a sleeve with an inorganic resist formed thereon in Example 4.

The thermal reaction type inorganic resist layer 43 with the thickness (d) of 40 nm was formed on the sleeve. FIG. 23 shows a cross-sectional view of the sleeve with the thermal reaction type inorganic resist layer formed thereon. In other words, such a configuration was obtained that the etching layer 44 and the inorganic resist layer 43 were provided on the aluminum pipe 45 on the mold 41. In addition, when fluctuations in the resist film thickness in the circumference of the sleeve with the resist formed thereon were measured by X-ray fluorescence, the fluctuation range was ±3 nm or less with respect to the objective thickness (d)=40 nm.

Thus prepared sleeve was exposed using the exposure apparatus as shown in FIG. 16. The exposure apparatus is installed with two lasers with different wavelengths i.e. laser for processing and laser for focus. FIG. 16 shows the apparatus together with the optical series. The exposure conditions were as described below.

Wavelength of the semiconductor laser for processing: 405 nm
Lens numerical aperture: 0.85
Power of the laser for exposure: 5 mW to 8 mW
Wavelength of the semiconductor laser for focus: 660 nm
Power of the laser for exposure: 0.2 mW
Rotation speed: 700 rpm
Feeding pitch: 400 nm/rotation
Sleeve exposure width: 200 mm It is possible to form various shapes and patterns by varying the intensity of the laser during the processing, but in the experiments, to confirm processing accuracy, continuous groove shapes were used as a pattern. The shape to form may be an isolated circle, elliptical shape and the like corresponding to required uses, and the invention is not limited absolutely in the processing shape. Further, the sleeve processing width was set at 200 mm, and the exposure apparatus enables the processing in widths longer than the processing width used in the experiments without any problem, while only the processing time increases as the processing width is increased.

Next, the resist exposed by the above-mentioned exposure apparatus was developed. As development, development by wet process was applied. A tetramethylammonium aqueous solution (TMAH) was used as a developing solution. A bath of TMAH solution with pH=13 was prepared at 20° C., the sleeve was immersed in the bath, and development was performed. The development time varies with the oxidation amount of Sn, and the development was performed for about 30 seconds to 5 minutes.

Thus developed sleeve was rinsed, the surface shape of the sleeve mold was examined using the SEM (scanning electron microscope), and it was found that fine grooves with depths of about 40 nm and widths of about 100 nm were formed on the sleeve.

After developing the sleeve, the etching layer was etched in the dry etching apparatus as shown in FIG. 12. In the dry etching apparatus, etching was performed by the method of not rotating the sleeve during the etching. A mixed gas of $O_2$ and $CHF_3$ (1:10) was used as an etching gas. The etching conditions were as described below.
Etching power: 150 W
Etching gas pressure: 10 Pa
Gas flow rate: 20 sccm
Frequency of high frequency wave: 13.56 MHz After etching, the sleeve was rinsed, and the step of removing (stripping off) the resist was performed. As resist stripping, a wet process was adopted. As a resist stripping solution, potassium hydroxide (KOH) was used. When the sleeve was immersed in a KOH solution with a concentration of 1M for about 5 minutes, the resist was stripped off cleanly with the $SiO_2$ layer left.

Thus etched sleeve was rinsed, the surface shape of the sleeve mold was examined using the SEM (scanning electron microscope), and it was found that grooves with depths of about 300 nm and widths of about 100 nm were formed in the perpendicular direction to the tangent of the sleeve surface.

Using the sleeve as a mold, the surface shape was transferred to a film using a UV curing resin, and almost the same shape as that of the sleeve mold was transferred onto the film as the inversed shape.

Example 5

Metal round bars processed in φ of 30 mm and φ of 78 mm were prepared, an aluminium pipe with a length of 200 mm, an inside diameter φ of 78 mm, and an outside diameter φ of 80 mm was attached to the outside of each of the bars, and cylindrical sleeve molds were configured as in Example 4.

Using the sputter apparatus as in Example 4, on the sleeve prepared as described above, an etching layer was first formed, and then, a thermal reaction resist was formed. To form the film uniformly on the sleeve, sputtering was performed while rotating the sleeve during the sputtering. As the etching layer, $SiO_2$ was used, and the film thickness was set at 100 nm. As the thermal reaction resist layer, SnOx (x=0.5) used in Example 4 was formed with the thickness (d) of 40 nm. In addition, when fluctuations in the resist film thickness in the circumference of the sleeve with the resist formed thereon were measured by X-ray fluorescence, the fluctuation range was ±3 nm or less with respect to the objective thickness (d)=40 nm.

The sleeve prepared as described above was exposed in the same exposure conditions as in Example 4. After exposure, the resist was developed using a TMAH solution. The development conditions were the same as the conditions in Example 4. After development, the etching layer was etched in the dry etching apparatus as shown in FIG. 14. In the dry etching apparatus, etching was performed while rotating the sleeve during the etching so as to etch the sleeve uniformly. A mixed gas of $O_2$ and $CHF_3$ (1:10) was used as an etching gas. The etching conditions were as described below.
Etching power: 150 W
Etching gas pressure: 10 Pa
Gas flow rate: 20 sccm
Frequency of high frequency wave: 13.56 MHz After etching, the sleeve was rinsed, and the step of removing (stripping off) the resist was performed. As resist stripping, a wet process was adopted. As a resist stripping solution, as in the developing solution, it is possible to apply acid, alkali, and other kinds, and herein, potassium hydroxide (KOH) was used. When the sleeve was immersed in a KOH solution with a concentration of 1M for about 5 minutes, the resist was stripped off cleanly with the $SiO_2$ layer left.

After resist stripping, the sleeve was rinsed, and a master sleeve was completed. Thus developed sleeve was rinsed, the surface shape of the sleeve mold was examined using the SEM (scanning electron microscope), and it was found that grooves with depths of about 100 nm and widths of about 100 nm were formed on the sleeve. Using the sleeve as a mold, the surface shape was transferred to a film using a UV curing resin, and almost the same shape as that of the sleeve mold was transferred onto the film as the inversed shape.

Example 6

Metal sleeves processed in φ of 30 mm and φ of 78 mm as in Example 4 were prepared, and cylindrical sleeves were configured.

Next, using the sputtering apparatus as shown in FIG. 8, as in Example 5, an etching layer with a thickness of 100 nm was formed on the sleeve prepared as described above, and then, a thermal reaction type inorganic resist layer with a thickness (d) of 40 nm was formed. By this means, the etching layer was formed on the sleeve, and the resist layer was formed on the etching layer. In addition, to form the film uniformly on the sleeve, sputtering was performed while rotating the sleeve during the sputtering. When fluctuations in the resist film thickness in the circumference of the sleeve with the resist formed thereon were measured by X-ray fluorescence, the fluctuation range was ±3 nm or less with respect to the objective thickness (d)=40 nm. Herein, a $SiO_2$ film was used as the etching layer. In this case, a target of $SiO_2$ was installed in the sputtering apparatus, and the sputtering was performed in an atmosphere of Ar gas. Further, as the thermal reaction type inorganic resist, $SnO_x$ (x=0.2) was used.

Thus prepared sleeve was exposed using the exposure apparatus as shown in FIG. 16. In addition, the exposure conditions were the same as in Example 4 except that only power of the laser for exposure was changed to 3 mW. After exposure, the resist was developed with a KOH solution.

After development, the etching layer 44 was etched using the etching apparatus as shown in FIG. 14. In addition, in order for the sleeve to be etched uniformly, etching was performed while rotating the sleeve during the etching. $CHF_3$ gas was used as an etching gas. Further, the etching conditions were as described below.
Etching power: 150 W
Etching gas pressure: 10 Pa
Gas flow rate: 20 sccm After etching, the sleeve was rinsed, and the resist was removed (stripped). As resist stripping, a wet process was adopted. As a resist stripping solution, as in the developing solution, it is possible to apply acid, alkali, and other kinds, and herein, TMAH was used. More specifically, the sleeve was immersed in a TMAH solution with a 2.38% concentration for about 5 minutes. By this means, the resist was stripped off cleanly with the $SiO_2$ layer left.

After resist stripping, the sleeve was rinsed, the surface shape of the sleeve mold was examined using the SEM (scanning electron microscope), and it was found that fine grooves with depths of about 100 nm and widths of about 100 nm were formed on the sleeve. Using the sleeve as a mold, the surface shape was transferred to a film using a UV curing resin, and almost the same shape as that of the sleeve mold was transferred onto the film as the inversed shape. The reason is considered that the thermal reaction type resist has the property of reacting in predetermined light intensity or more in the light intensity distribution of the spot diameter of the laser.

Example 7

Metal sleeves processed in φ of 30 mm and φ of 78 mm as in Example 4 were prepared, and cylindrical sleeves were configured.

Next, using the sputtering apparatus as shown in FIG. 8, as in Example 5, an etching layer with a thickness of 350 nm was formed on the sleeve prepared as described above, and then, a thermal reaction type inorganic resist layer with a thickness (d) of 40 nm was formed. By this means, the etching layer was formed on the sleeve, and the resist layer was formed on the etching layer. In addition, to form the film uniformly on the sleeve, sputtering was performed while rotating the sleeve during the sputtering. When fluctuations in the resist film thickness in the circumference of the sleeve with the resist formed thereon were measured by X-ray fluorescence, the fluctuation range was ±3 nm or less with respect to the objective thickness (d)=40 nm. Herein, a $SiO_2$ film was used as the etching layer. In this case, a target of $SiO_2$ was installed in the sputtering apparatus, and the sputtering was performed in an atmosphere of Ar gas. Further, as the thermal reaction type inorganic resist, $Cr_{1-x}O_x$, $Nb_{1-b}O_x$, $Ta_{1-x}O_x$, and $Ti_{1-x}O_x$ were used. The film formation conditions of each material were shown in Table 3.

TABLE 3

| Etching layer and resist | Target | Power (W) | Ratio (%) of O2 to Ar | Pressure (Pa) | Film thickness (nm) | X value |
|---|---|---|---|---|---|---|
| SiO2 | SiO2 (4 in Φ) | R.F.250 | 0 | 0.5 | 350 | — |
| CrOx | Cr (2 in Φ) | D.C.80 | 1.6 | 0.5 | 40 | 0.24 |
| NbOx | Nb (2 in Φ) | D.C.80 | 2 | 0.5 | 40 | 0.11 |
| TaOx | Ta (2 in Φ) | D.C.100 | 2 | 0.5 | 40 | 0.17 |
| TiOx | Ti (2 in Φ) | D.C.80 | 4 | 0.5 | 40 | 0.18 |
| SnOx | Sn (2 in Φ) | D.C.15 | 4 | 0.5 | 40 | 0.1 |
| WOx | W (2 in Φ) | D.C.80 | 10 | 0.5 | 75 | 0.4 |

Thus prepared sleeves were exposed using the exposure apparatus as shown in FIG. 16. In addition, the exposure conditions were the same as in Example 4 except that power of the laser for exposure was changed to be optimal for each resist. After exposure, each resist was developed under the conditions as shown in Table 4. After development, the etching layer 44 was etched using the etching apparatus as shown in FIG. 14. In addition, in order for the sleeve to be etched uniformly, etching was performed while rotating the sleeve during the etching. $CF_4$ gas was used as an etching gas. Further, the etching conditions were as described below.

Etching power: 150 W

Etching gas pressure: 10 Pa

Gas flow rate: 20 sccm

TABLE 4

| | Resist | Developing solution | Development time (min) | Opening width/depth (nm) | Etching depth/resist thickness (nm) | Aspect ratio |
|---|---|---|---|---|---|---|
| Example | | | | | | |
| 7 | CrOx | Ceric ammonium nitrate + Nitric acid | 1 | 250/40 | 350/40 | 1.4 |
| 7 | NbOx | Nitric acid | 20 | 100/40 | 350/30 | 3.5 |
| 7 | TaOx | Potassium Hydroxide | 15 | 100/40 | 350/40 | 3.5 |
| 7 | TiOx | TMAH | 5 | 200/40 | 350/40 | 1.8 |
| Comparative Example | | | | | | |
| 2 | WOx | TMAH | 15 | 150/75 | — | — |

After resist stripping, the sleeve was rinsed, the surface shape of the sleeve mold was examined using the SEM (scanning electron microscope), and it was found that fine grooves with depths of about 100 nm and widths of about 100 nm were formed on the sleeve. Using the sleeve as a mold, the surface shape was transferred to a film using a UV curing resin, and almost the same shape as that of the sleeve mold was transferred onto the film as the inversed shape. The reason is considered that the thermal reaction type resist has the property of reacting in predetermined light intensity or more in the light intensity distribution of the spot diameter of the laser.

Comparative Example 1

Metal round bars processed in φ of 30 mm and φ of 78 mm were prepared, an aluminium pipe with a length of 200 mm, an inside diameter φ of 78 mm, and an outside diameter φ of 80 mm was attached to the outside of each of the bars, and cylindrical sleeve molds were configured as in Example 4.

Using the sputter apparatus as in Example 4, an etching layer 44 was first formed on the sleeve prepared as described above. As the etching layer, $SiO_2$ was used as in Example 5. Sputtering was performed using a target of $SiO_2$ with Ar gas. The film thickness of the etching layer was set at 1 μm.

Figure 24:
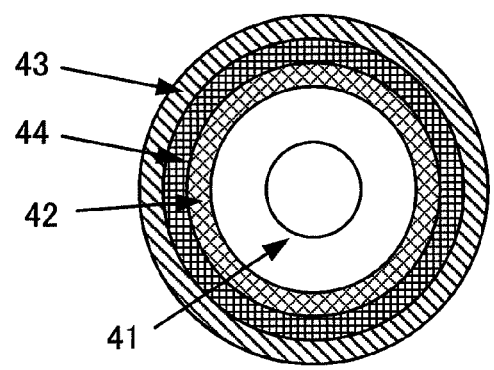
FIG. 24 is a diagram showing a cross-sectional view of a sleeve mold in Comparative Example 1.

Next, using the apparatus as shown in FIG. 21, an organic resist 43 was coated. The apparatus is an apparatus for immersing the sleeve in a container with the resist therein, lifting and then rotating, and thereby applying the resist. By using the apparatus, it was possible to apply the resist onto the sleeve surface uniformly. Used as the organic resist was PMER P AR900 (made by TOKYO OHKA KOGYO Co., LTD.). The coating thickness (d) was set at 5 μm. FIG. 24 shows a cross-sectional view of the sleeve prepared by the aforementioned method. In other words, such a configuration was obtained that the etching layer 44 and organic resist layer 43 were provided on the aluminium pipe 45 on the mold 41. When fluctuations in the resist film thickness in the circumference of the sleeve with the resist formed thereon were measured using a profilemeter, the fluctuation range was ±1 µm or more with respect to the thickness (d)=5 µm.

Figure 25:
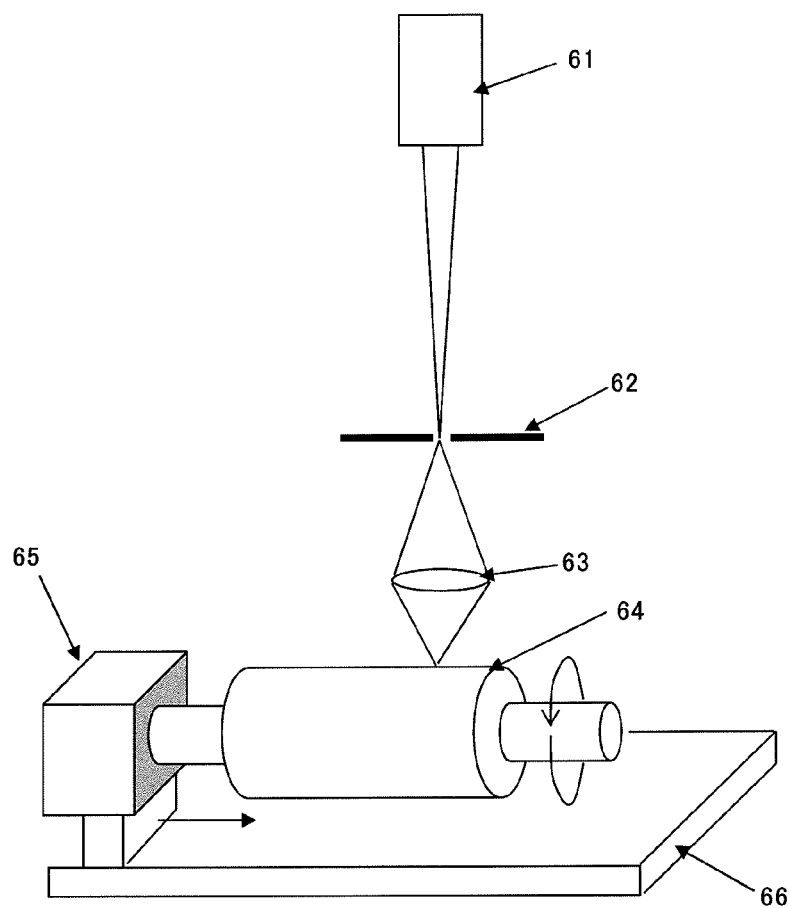
FIG. 25 is a schematic view showing an example of a configuration of an exposure apparatus and optical series in Comparative Example 1.

Thus prepared sleeve was exposed using an exposure apparatus as shown in FIG. 25. The exposure apparatus has the function of installing a sleeve 64 in a spindle motor 65 to enable rotation, and further has the function of moving up, down, rightward and leftward by an XY stage 66. To expose the sleeve, light output from a blue laser light source 61 was condensed to the sleeve surface by a lens 63 through a pinhole slit 62. In addition, since the exposure apparatus does not have the autofocus function, the spot diameter varies during the rotation due to fluctuations in the rotation axis and processing error of the sleeve. Using the aforementioned apparatus, exposure was performed under the conditions described below.

Wavelength of the semiconductor laser for processing: 473 nm
Lens numerical aperture: 0.25
Power of the laser for exposure: 15 mW
Rotation speed: 30 rpm
Feeding pitch: 50 µm/rotation
Processing width: 22 µm Development was performed after exposure. P-7G was used as a developing solution. The development time was 2 minutes. After development, the etching layer was etched using the dry etching apparatus as shown in FIG. 14. In the dry etching apparatus, in order for the sleeve to be etched uniformly, etching was performed while rotating the sleeve during the etching. $CF_4$ gas was used as an etching gas. The etching conditions were the same as in Example 5.

After etching, subsequently in the same etching apparatus, such a step was performed that the resist was removed (stripped) by ashing by $O_2$ gas using a method of applying a high frequency wave with a counter electrode. After resist stripping, the sleeve was rinsed, and the sleeve mold was completed. When the surface shape of the sleeve was examined using the SEM, it was found that grooves with depths of 1 µm, widths of 22 µm and pitches of 50 µm were formed on the sleeve. Studies were made using this method while varying the exposure conditions, but it was not possible to form a structure of the submicron size with a width 1 µm or less on the sleeve.

Comparative Example 2

As in Example 4, metal sleeves processed in φ of 30 mm and φ of 78 mm were prepared, and cylindrical sleeves were configured.

Next, using the sputtering apparatus as shown in FIG. 8, as in Example 5, an etching layer with a thickness of 350 nm was formed on the sleeve prepared as described above, and then, a thermal reaction type inorganic resist layer with a thickness (d) of 40 nm was formed. By this means, the etching layer was formed on the sleeve, and the resist layer was formed on the etching layer. In addition, to form the film uniformly on the sleeve, sputtering was performed while rotating the sleeve during the sputtering. When fluctuations in the resist film thickness in the circumference of the sleeve with the resist formed thereon were measured by X-ray fluorescence, the fluctuation range was ±3 nm or less with respect to the thickness (d)=40 nm. Herein, a $SiO_2$ film was used as the etching layer. In this case, a target of $SiO_2$ was installed in the sputtering apparatus, and the sputtering was performed in an atmosphere of Ar gas. Further, as the thermal reaction type inorganic resist, element W such that the boiling point of the primary fluoride is 200° C. or less was selected, and WOx was used as the thermal reaction type resist. The film formation conditions were shown in Table 3.

Thus prepared sleeve was exposed using the exposure apparatus as shown in FIG. 16. In addition, the exposure conditions were the same as in Example 4 except that power of the laser for exposure was changed to be the most suitable for the WOx resist. After exposure, the WOx resist was developed under the conditions as shown Table 4. After development, the etching layer 44 was etched using the etching apparatus as shown in FIG. 14. The etching was performed under the same conditions as in Example 7. After etching, when the shape of the roll surface and cross-section shape were examined using the SEM (scanning electron microscope), the resist disappeared, and a clear concavo-convex pattern was not observed. The reason is considered that the thermal reaction type resist was volatized as a fluoride by drying etching, and did not serve the effect of a mask.

INDUSTRIAL APPLICABILITY

The present invention is applicable to fabrication of seamless molds for nanoimprint and optical films enabling a fine shape of large-size to be formed.

The invention claimed is:
1. A seamless mold manufacturing method comprising:
    forming a thermal reactive resist layer on a cylindrical-shaped mold;
    forming a fine mold pattern on the thermal reactive resist layer using a laser;
    forming an etching layer on the cylindrical-shaped mold before forming the thermal reactive resist layer; and
    etching the etching layer using the fine mold pattern as a mask,
    wherein the thermal reactive resist layer is comprised of a thermal reactive resist material having a property of reacting in at least a predetermined light intensity in a light intensity distribution within a spot diameter of the laser,
    wherein, when the etching layer is etched, a dry etching apparatus is used in which a cylindrical counter electrode is arranged in a position opposed to the cylindrical-shaped mold in a vacuum chamber, a space being defined between the cylindrical counter electrode and an outer periphery of a curved surface of the cylindrical-shaped mold, and
    wherein an incident direction of the etching extends from the curved surface toward a center of the cylindrical-shaped mold, the incident direction consisting of a direction perpendicular to a tangential direction of the surface of the cylindrical-shaped mold.
2. A seamless mold manufacturing method comprising:
    forming a thermal reactive resist layer on a cylindrical-shaped mold;
    forming a fine mold pattern on the thermal reactive resist layer using a laser;
    forming an etching layer on the cylindrical-shaped mold before forming the thermal reactive resist layer; and
    etching the etching layer using the fine mold pattern as a mask,
    wherein the thermal reactive resist layer is comprised of a thermal reactive resist material having a temperature distribution including a region where the resist reacts at a predetermined temperature or more within a spot diameter of the laser, wherein, when the etching layer is etched, a dry etching apparatus is used in which a cylindrical counter electrode is arranged in a position opposed to the cylindrical-shaped mold in a vacuum chamber, a space being defined between the cylindrical counter electrode and an outer periphery of a curved surface of the cylindrical-shaped mold, and wherein an incident direction of the etching extends from the curved surface toward a center of the cylindrical-shaped mold, the incident direction consisting of a direction perpendicular to a tangential direction of the surface of the cylindrical-shaped mold.

3. The seamless mold manufacturing method according to claim 2, further comprising:

removing the fine mold pattern.

4. The seamless mold manufacturing method according to claim 2, wherein the thermal reactive resist is an organic resist or an inorganic resist.

5. The seamless mold manufacturing method according to claim 2, wherein the thermal reactive resist is comprised of an imperfect oxide of an element selected from the group consisting of transition metals and group-XII to group-XV elements, and a boiling point of a primary fluoride of the element is 200° C. or more.

6. The seamless mold manufacturing method according to claim 5, wherein the transition metals are elements selected from the group consisting of Ti, Cr, Mn, Fe, Co, Ni, Cu, Zr, Nb, Rh, Ag, Hf, Ta and Au.

7. The seamless mold manufacturing method according to claim 5 or 6, wherein the group-XII to group-XV elements are elements selected from the group consisting of Al, Zn, Ga, In, Sn, Sb, Pb and Bi.

8. The seamless mold manufacturing method according to claim 5, wherein the transition metals are elements selected from the group consisting of Ti, Cr, Mn, Co, Cu, Nb, Ag, Ta and Au, and the group-XII to group-XV elements are elements selected from the group consisting of Sn, Pb and Bi.

9. The seamless mold manufacturing method according to claim 3, wherein the etching layer is comprised of a material selected from the group consisting of Si, Ta, and oxides, nitrides and carbides of Si and Ta.

10. The seamless mold manufacturing method according to claim 2, wherein a film thickness of the thermal reactive resist layer has a fluctuation range of ±20 nm or less in a circumference of the sleeve in the film thickness.

11. The seamless mold manufacturing method according to claim 2, wherein the thermal reactive resist layer is comprised of at least two layers.

12. The seamless mold manufacturing method according to claim 3, further comprising:

forming a heat absorption layer above the etching layer.

13. The seamless mold manufacturing method according to claim 12, wherein forming the heat absorption layer on or under the etching layer is before forming the thermal reactive resist layer on the etching layer.

14. The seamless mold manufacturing method according to claim 3, further comprising:

forming a heat insulating layer on the cylindrical-shaped mold before forming the etching layer on the cylindrical-shaped mold.

15. The seamless mold manufacturing method according to claim 2, wherein a method of forming any one of the thermal reactive resist layer, the etching layer and the heat absorption layer is formed by a sputtering method, a deposition method or a CVD method.

16. The seamless mold manufacturing method according to claim 2, wherein a beam shape of the laser is an elliptical shape in exposure using the laser.

17. The seamless mold manufacturing method according to claim 1, wherein an electric field is formed, between the cylindrical-shaped mold and the cylindrical counter electrode, in a direction toward a center of the cylindrical-shaped mold and perpendicular to a tangential direction of the surface of the cylindrical-shaped mold.

18. The seamless mold manufacturing method according to claim 17, wherein the light intensity of the laser defines a Gaussian distribution, and the temperature of the thermal reactive resist layer, onto which laser light is irradiated by the laser, defines the same Gaussian distribution as that defined by the light intensity of the laser.

19. The seamless mold manufacturing method according to claim 18, wherein the laser is semiconductor laser.

* * * * *